(12) United States Patent
Kanai et al.

(10) Patent No.: US 10,811,350 B2
(45) Date of Patent: Oct. 20, 2020

(54) POWER MODULE

(71) Applicant: SHARP KABUSHIKI KAISHA, Sakai, Osaka (JP)

(72) Inventors: Hiroki Kanai, Sakai (JP); Tomotoshi Satoh, Sakai (JP); Kenichi Tanaka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/427,675

(22) Filed: May 31, 2019

(65) Prior Publication Data

US 2019/0371722 A1 Dec. 5, 2019

(30) Foreign Application Priority Data

Jun. 1, 2018  (JP) .................................. 2018-106507
Mar. 8, 2019  (JP) .................................. 2019-043091

(51) Int. Cl.
*H01L 23/498* (2006.01)
*H01L 23/00* (2006.01)

(52) U.S. Cl.
CPC .. *H01L 23/49844* (2013.01); *H01L 23/49822* (2013.01); *H01L 24/16* (2013.01); *H01L 2224/32227* (2013.01)

(58) Field of Classification Search
CPC ......... H01L 23/49844; H01L 23/49822; H01L 24/16
See application file for complete search history.

(56) References Cited

U.S. PATENT DOCUMENTS

| | | | | |
|---|---|---|---|---|
| 8,225,502 | B2* | 7/2012 | Kaneko | H01L 21/4857 174/262 |
| 2010/0200279 | A1* | 8/2010 | Kariya | H01L 23/49827 174/255 |
| 2014/0353027 | A1* | 12/2014 | Osaki | H05K 1/0251 174/264 |
| 2018/0047661 | A1* | 2/2018 | Oshima | H01L 23/16 |

FOREIGN PATENT DOCUMENTS

| JP | 2015-070063 A | 4/2015 |
|---|---|---|
| JP | 2016-092039 A | 5/2016 |

* cited by examiner

*Primary Examiner* — Peniel M Gumedzoe
(74) *Attorney, Agent, or Firm* — ScienBiziP, P.C.

(57) ABSTRACT

A primary-side electrode and a secondary-side electrode of a power device are disposed so as to straddle plural separate primary and secondary wires in a first conductive layer, a second conductive layer includes plural separate primary and secondary wires, an insulating part is disposed in a first insulating layer in a region between the primary and secondary wires and directly below the power device, an intralayer insulating part is disposed in the second conductive layer in a region between the primary and secondary wires and directly below the power device, and a via that connects the primary wire in the first conductive layer and the primary wire in the second conductive layer and connects the secondary wire in the first conductive layer and the secondary wire in the second conductive layer is disposed in the first insulating layer directly below the primary-side and secondary-side electrodes of the power device.

20 Claims, 21 Drawing Sheets

POWER MODULE

BACKGROUND

1. Field

The present disclosure relates to a power module including a power device.

2. Description of the Related Art

In recent years, people are tackling environmental issues worldwide, and under such a circumstance, environment-friendly energy markets such as wind power generation and solar power generation are expanding. As a result of expansion of the markets, demands for a power module are rapidly increasing. Such a power module is required to have a large electric current and an improved switching speed so that the power module can be mounted in electric vehicles, wind-power and solar-power generation devices, and the like.

A conventional power module achieves a large electric current and an improvement in switching speed by employing a multilayer substrate structure including a thin conductor layer that is a wiring pattern for a signal and a thick conductor layer for a large electric current, as disclosed, for example, in Japanese Unexamined Patent Application Publication No. 2016-92039.

In general, it is preferable that a conductor layer that forms a circuit pattern be thick in order to pass a large electric current in a power module. However, in a case where the conductor layer is thick, it is necessary to secure a large distance between the patterns in advance, because a distance between adjacent patterns becomes small due to a wet etching restriction. Therefore, it is difficult to achieve a fine circuit pattern.

The wet etching restriction is described below with reference to FIGS. 11A through 11C. Copper, which has good electrical conductivity, is sometimes used for a wire. In wet etching, a copper foil 202 is attached onto an insulating layer 203, and etching is performed after applying a resist 201 onto a pattern formation part, as illustrated in FIG. 11A.

However, since wet etching is performed isotropically, an upper part of the copper foil 202 is also etched in a width direction in a case where etching is performed until a bottom part of the copper foil 202 is completely separated, as illustrated in FIGS. 11B and 11C. As a result, a distance between circuit patterns 204a or 204b in the upper part of the copper foil 202 becomes larger as the copper foil 202 becomes thicker. That is, a distance between circuit patterns undesirably becomes larger as a conductor layer becomes thicker.

In this respect, for example, in the technique disclosed in Japanese Unexamined Patent Application Publication No. 2015-70063, etching is performed after an aluminum plate is joined to a ceramic substrate, and then etching is performed after a copper plate is joined. This makes it unnecessary to form a deep etching groove in one etching, thereby keeping a difference in etching groove width in a thickness direction small.

Next, FIG. 12 illustrates a structure of a conventional power module 103. As illustrated in FIG. 12, the power module 103 includes a multilayer substrate in which a first conductive layer 3 having electric conductivity, a first insulating layer 5 having insulation properties, a second conductive layer 4 having electric conductivity, and a second insulating layer 6 having insulation properties are stacked in this order. A power device 1 is flip-chip-mounted on the first conductive layer 3 through solder 2. A primary-side electrode and a secondary-side electrode of the power device 1 are disposed so as to straddle a plurality of separate primary and secondary wires in the first conductive layer 3. The second conductive layer 4 includes a plurality of separate primary and secondary wires. Furthermore, an intralayer insulating part 10c is disposed in a region that is between the primary wire and the secondary wire in the second conductive layer 4 and is directly below the power device 1.

In the power module 103 illustrated in FIG. 12, $\theta > \pi/2$ is satisfied where $\theta$ is an angle formed in the second conductive layer 4 between the first insulating layer 5 and a boundary between the intralayer insulating part 10c and the second conductive layer 4. Accordingly, there is a region where an electric current path 50c passes only the thin first conductive layer 3 when an electric current flows into the power device 1. For this reason, the power module 103 has a risk of concentration of an electric current at a part where an electrode in the power device 1 and the first conductive layer 3 are in contact with each other. This undesirably increases an electric current density and a wire temperature directly below the electrode of the power device 1, thereby restricting an electric current capacity of an electric current passed through the power module 103.

An aspect of the present disclosure was accomplished in view of the above problems and provides a power module that can increase an electric current capacity of the power module while suppressing an increase in electric current density and wire temperature directly below a power device.

SUMMARY

According to an aspect of the disclosure, there is provided a power module including a multilayer substrate in which at least a first conductive layer having electrical conductivity, a first insulating layer having insulation properties, and a second conductive layer having electrical conductivity are stacked in this order. A primary-side electrode and a secondary-side electrode of a power device are disposed so as to straddle a plurality of separate primary and secondary wires in the first conductive layer. The second conductive layer includes a plurality or separate primary and secondary wires. An insulating part is disposed in the first insulating layer in a region that is between the primary wire and the secondary wire and is directly below the power device. An intralayer insulating part is disposed in the second conductive layer in a region that is between the primary wire and the secondary wire and is directly below the power device. One or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device.

According to an aspect of the disclosure, there is provided a power module including a multilayer substrate in which at least a first conductive layer having electrical conductivity, a first insulating layer having insulation properties, and a second conductive layer having electrical conductivity are stacked in this order. A primary-side electrode and a secondary-side electrode of a power device are disposed so as to straddle a plurality of separate primary and secondary wires in the first conductive layer. The second conductive layer includes a plurality of separate primary and secondary wires. An insulating part is disposed in the first insulating layer in a region that is between the primary wire and the secondary wire and is directly below the power device. One or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device.

BRIEF DESCRIPTION OF THE DRAWINGS

FIG. 19A illustrates a case where an angle θ3 is π/2 and FIG. 19B illustrates a case where the angle θ3 is π/4;

DESCRIPTION OF THE EMBODIMENTS

First Embodiment

Figure 1:
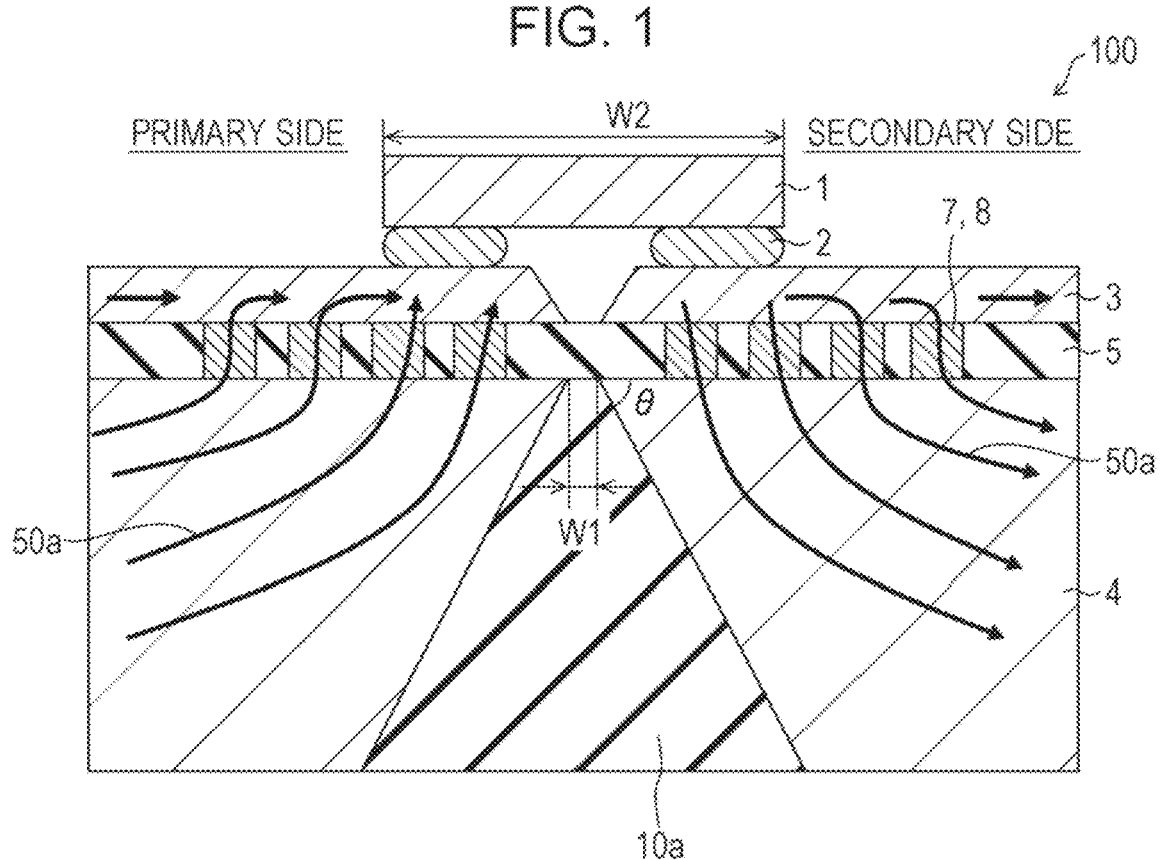
FIG. 1 is a cross-sectional view of a power module according to the first embodiment of the present disclosure.

An embodiment of the present disclosure is described below in detail. As illustrated in FIG. 1, a power module 100 according to the first embodiment of the present disclosure includes a power device 1, solder 2, a first conductive layer 3, a second conductive layer 4, and a first insulating layer 5. A plurality of vias 7 filled with a via filler 8 are formed in the first insulating layer 5. Note, however, that a sinale via 7 may be formed in the first insulating layer 5. An intralayer insulating part 10a is disposed in a region between a primary-side second conductive layer 4 and a secondary-side second conductive layer 4 and directly below the power device 1.

Power Device 1

The power device 1 is a semiconductor element that performs, for example, conversion and control of electric power and conversion (rectification) from an alternating-current power to a direct-current power. Examples of the kind of power device 1 include, but are not limited to, a metal-oxide semiconductor field-effect transistor (MOSFET), an insulated gate bipolar transistor (IGBT), and a thyristor, and examples of a material for the power device 1 include, but are not limited to, silicon, gallium nitride (GaN), silicon carbide (SiC), and gallium oxide.

The power device 1 is disposed on the first conductive layer 3 through the solder 2 by flip chip connection. A primary-side electrode and a secondary-side electrode of the power device 1 are disposed so as to straddle a plurality of separate primary and secondary wires in the first conductive layer 3. The second conductive layer 4 includes a plurality of separate primary and secondary wires. The solder 2 is preferably high-temperature solder. In a case where the solder 2 is high-temperature solder, a connection part does not melt in a process of secondary mounting of the power module 100. A method such as connection using an electrically-conductive adhesive (electrically-conductive paste), pressure bonding involving application of heat, or joining using an ultrasonic wave may be employed as a method of flip chip connection.

Configuration of Multilayer Substrate

The first conductive layer 3, the first insulating layer 5, and the second conductive layer 4 are stacked in this order from top to bottom so as to constitute a multilayer substrate. The first conductive layer 3 and the second conductive layer 4 are layers having electrical conductivity and made, for example, of copper. A material for the first conductive layer 3 and the second conductive layer 4 not limited in particular, provided that the material has electrical conductivity. Specific examples of the material include, but are not limited to, copper and aluminum.

The first conductive layer 3 and the second conductive layer 4 may be made of the same material or may be made of different materials. Furthermore, for example, a thickness of the first conductive layer 3 and a thickness of the second conductive layer 4 are, but are not limited to, 0.14 mm and 1 mm, respectively. The thickness of the second conductive layer 4 is preferably larger than the thickness of the first conductive layer 3. According to the configuration, the first conductive layer 3 can be made thin to a degree such that a fine circuit structure can be formed, and the second conductive layer 4 can be made thick so that an electric current capacity can be increased. This allows the power module 100 to have a fine circuit structure and have a large electric current capacity.

In the first conductive layer 3, an opening is formed, for example, by etching at a position between solder 2 directly below the power device 1. According to the configuration, an electric current path 50a efficiently flows into the power device 1. The opening may be filled with an insulating material.

In the first insulating layer 5, an insulating part is disposed in a region between the primary wire and the secondary wire and directly below the power device 1.

The first insulating layer 5 is made of an insulating material. Specific examples of the insulating material include, but are not limited to, glass epoxy and polyimide.

A via 7 that connects the first conductive layer 3 of the primary wiring and the second conductive layer 4 of the primary wiring, and connects the first conductive layer 3 of the secondary wiring and the second conductive layer 4 of the secondary wiring is disposed in the first insulating layer 5 directly below the primary-side electrode and the secondary-side electrode of the power device 1.

The via 7 is a hole that passes through the first insulating layer 5. A plurality of vias 7 are preferably-provided in the first insulating layer 5. The vias 7 have, for example, a cylindrical shape, but the shape of the vias 7 is not limited to this and may be a rectangular parallelepiped or another shape. The vias 7 are filled with the via filler 8. The via filler 8 is a material having electrical conductivity and is preferably the same material as the material of the first conductive layer 3 and/or the second conductive layer 4. Examples of such a material include, but are not limited to, copper and aluminum.

The vias 7 are formed by filling a plurality of grooves formed in the first insulating layer 5 with the via filler 8, for example, by via-fill plating or a damascene process. The via-fill plating is a plating method for preferentially precipitating copper in a via hole by using copper sulfate plating bath to which an inhibitor that inhibits plating growth and a promotor that promotes plating growth are added. According to the damascene process, in which the via filler 8 is deposited on a base structure of the first insulating layer 5 having grooves and then chemical mechanical polishing (CMP) is performed, a surface can be flattened while leaving the via filler 8 in the grooves.

It is preferable that a total area of cross sections of the plurality of vias 7 parallel with a substrate surface be larger than an area of a cross section of the first conductive layer 3 perpendicular to a direction of flow of an electric current. The area of the cross section of the first conductive layer 3 perpendicular to the direction of flow of an electric current can be calculated as follows: the thickness of the first conductive layer 3× a length of the first conductive layer 3 in a depth direction. According to the configuration, an electric current easily flows from the first conductive layer 3 to the thick second conductive layer 4 through the vias 7. This makes it possible to suppress concentration of an electric current density directly below the electrodes of the power device 1.

Intralayer Insulating Part 10a

The intralayer insulating part 10a is disposed in a region that is between the primary wire and the secondary wire of the second conductive layer 4 and is directly below the power device 1. The intralayer insulating part 10a is made of an insulating material. Specific examples of the insulating material include, but are not limited to, aluminum nitride. The insulating material may be the same as the material of the first insulating layer 5. The intralayer insulating part 10a may be a hollow space constituted, for example, by air.

The intralayer insulating part 10a has a structure such that a space formed, for example, by etching is filled with an insulator. The intralayer insulating part 10a is formed as a tapered shape having a narrow upper part and a wide lower part by performing wet etching on the second conductive layer 4 from the lower part. Then, a space thus formed as a tapered shape is filled with an insulator.

A width W1, in a direction parallel with the substrate surface, of a part where the intralayer insulating part 10a is in contact with the first conductive layer 3 is smaller than a width W2 of the power device 1 in the direction parallel with the substrate surface. This allows a via to be provided directly below the electrodes of the power device 1. Accordingly, even in a case where a distance between the electrodes of the power device 1 is short, the electric current path 50a that passes the via 7 directly below the electrodes of the power device 1 can be formed, and therefore an electric current equal to or higher than an allowable current density in the first conductive layer 3 does not flow. This can suppress a rise in electric current density and a rise in wire temperature, thereby allowing an increase in electric current capacity of the power module 100.

Furthermore, the etching is preferably performed so that $\theta < \pi/2$ is satisfied where $\theta$ is an angle formed in the second conductive layer 4 between the first insulating layer 5 and a boundary between the intralayer insulating part 10a and the second conductive layer 4. According to the configuration that satisfies this relationship, an area of a part where the first insulating layer 5 and the intralayer insulating part 10a are in contact with each other directly below the power device 1 is small. This allows the via 7 to be also formed in a region of the first insulating layer 5 directly below the power device 1. In this case, the electric current path 50a can pass both of the first conductive layer 3 and the second conductive layer 4 even in the region directly below the electrodes of the power device 1. As a result, an electric current density does not become large, and an electric current capacity of the power module 100 can be increased.

A plurality of vias 7 are preferably formed in the region directly below the electrodes of the power device 1. According to the configuration, there are a plurality of electric current paths 50a through which an electric current flows from the second conductive layer 4 to the first conductive layer 3. This suppresses a rise in electric current density. A plurality of vias 7 are more preferably formed in a region directly below the solder 2 in the region directly below the electrodes of the power device 1. According to the configuration, an electric current equal to or higher than an allowable current density in the first conductive layer 3 does not flow. As a result, the efficient electric current paths 50a through which an electric current directly flows from the second conductive layer 4 having a large electric current capacity into the power device 1 are formed.

Effects

As described above, according to the present embodiment, the intralayer insulating part 10a is formed in the second conductive layer 4 so that the relationship π/2 is satisfied. This allows the via 7 to be formed in the region directly below the electrodes of the power device 1. According to the configuration, the electric current path 50a can pass both of the first conductive layer 3 and the second conductive layer 4 even in the region directly below the electrodes of the power device 1. This makes it possible to suppress a rise in electric current density and wire temperature in the region directly below the electrodes of the power device 1, thereby allowing an increase in electric current capacity of the power module 100.

Second Embodiment

Another embodiment of the present disclosure is described below. For convenience of description, members having functions identical to those of the members described in the above embodiment are given identical reference signs, and repeated description thereof is omitted.

Figure 2:
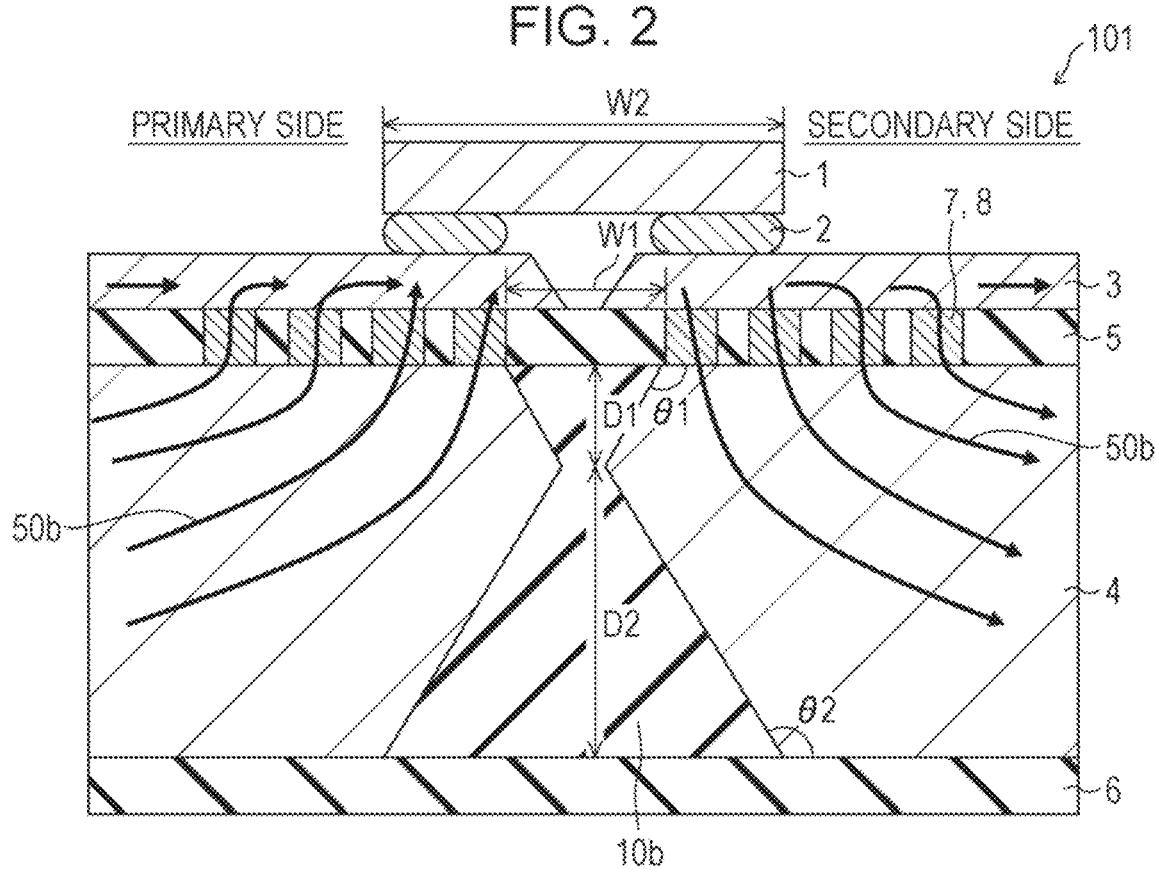
FIG. 2 is a cross-sectional view of a power module according to the second embodiment of the present disclosure.

As illustrated in FIG. 2, a power module 101 according to the second embodiment of the present disclosure includes a power device 1, solder 2, a first conductive layer 3, a second conductive layer 4, a first insulating layer 5, and a second insulating layer 6. The second insulating layer 6 is made of an insulating material. Specific examples of the insulating material include, but are not limited to, glass epoxy and polyimide.

A primary-side electrode and a secondary-side electrode of the power device 1 are disposed so as to straddle a plurality of separate primary and secondary wires in the first conductive layer 3. The second conductive layer 4 includes a plurality of separate primary and secondary wires. An intralayer insulating part 10b is disposed in a region that is between the primary wire and the secondary wire in the second conductive layer 4 and is directly below the power device 1.

A via 7 that connects the first conductive layer 3 of the primary wiring and the second conductive layer 4 of the primary wiring, and connects the first conductive layer 3 of the secondary wiring and the second conductive layer 4 of the secondary wiring is disposed in the first insulating layer 5 directly below the primary-side electrode and the secondary-side electrode of the power device 1. The intralayer insulating part 10b may be a hollow space constituted, for example, by air.

The power module 101 is different from the power module 100 according to the first embodiment in that θ1>π/2 and θ2>π/2 are satisfied where θ1 is an angle formed in the second conductive layer 4 between the first insulating layer 5 and a boundary between the intralayer insulating part 10b and the second conductive layer 4 and θ2 is an angle formed in the second conductive layer 4 between the second insulating layer 6 and a boundary between the intralayer insulating part 10b and the second conductive layer 4. In the present embodiment, the intralayer insulating part 10b is disposed in a region that is between a primary-side second conductive layer 4 and a secondary-side second conductive layer 4 and is directly below the power device 1.

In the present embodiment, a width W1, in a direction parallel with a substrate surface, of a part where the intralayer insulating part 10b is in contact with the first conductive layer 3 is smaller than a width W2 of the power device 1 in a direction parallel with the substrate surface. This allows a via to be provided directly below the electrodes of the power device 1. Accordingly, even in a case where a distance between the electrodes of the power device 1 is short, an electric current path 50b that passes the via 7 directly below the electrodes of the power device 1 can be formed, and therefore an electric current equal to or higher than an allowable current density in the first conductive layer 3 does not flow. This can suppress a rise in electric current density and a rise in wire temperature, thereby allowing an increase in electric current capacity of the power module 101.

In the present embodiment, the intralayer insulating part 10b is formed by half-etching the second conductive layer 4 from an upper part and a lower part thereof so that an etching groove in the upper part and an etching groove in the lower part are continuous with each other. As a result, the intralayer insulating part 10b has a shape that satisfies the relationships θ1>π/2 and θ2>π/2. According to the configuration, a taper in the etching groove formed from the upper part is shorter than that illustrated in FIG. 12, and therefore the via 7 can be formed in the region directly below the electrodes of the power device 1 even in a case where a distance between the electrodes of the power device 1 is short. Accordingly, an electric current equal to or higher than an allowable current density in the first conductive layer 3 does not flow through the electric current path 50b. This makes it possible to suppress an electric current density, thereby allowing an increase in electric current capacity of the power module 101.

As for depth of the half-etching processing, etching from the upper part of the second conductive layer 4 is preferably shallower than etching from the lower part of the second conductive layer 4. That is, a relationship depth D1<depth D2 illustrated in FIG. 2 is preferably satisfied. This makes it possible to form a larger number of vias 7 in the region directly below the power device 1, thereby effectively suppressing an electric current density.

It is preferable that a total area of cross sections of the plurality of vias 7 parallel with the substrate surface be larger than an area of a cross section of the first conductive layer 3 perpendicular to a direction of flow of an electric current. The area of the cross section of the first conductive layer 3 perpendicular to the direction of flow of an electric current can be calculated as follows: the thickness of the first conductive layer 3×a length of the first conductive layer 3 in a depth direction. According to the configuration, an electric current easily flows from the first conductive layer 3 to the thick second conductive layer 4 through the vias 7. This makes it possible to suppress concentration of an electric current density directly below the power device 1.

Effects

As described above, according to the present embodiment, the intralayer insulating part 10b is formed in the second conductive layer 4 so that the relationships $\theta1 > \pi/2$ and $\theta2 > \pi/2$ are satisfied. This allows the via 7 to be formed in the region directly below the electrodes of the power device 1. According to the configuration, the electric current path 50b can pass both of the first conductive layer 3 and the second conductive layer 4 even in the region directly below the electrodes of the power device 1. This makes it possible to suppress a rise in electric current density and wire temperature in the region directly below the electrodes of the power device 1, thereby allowing an increase in electric current capacity of the power module 101.

Third Embodiment

Another embodiment of the present disclosure is described below. For convenience of description, members having functions identical to those of the members described in the above embodiments are given identical reference signs, and repeated description thereof is omitted.

Figure 3:
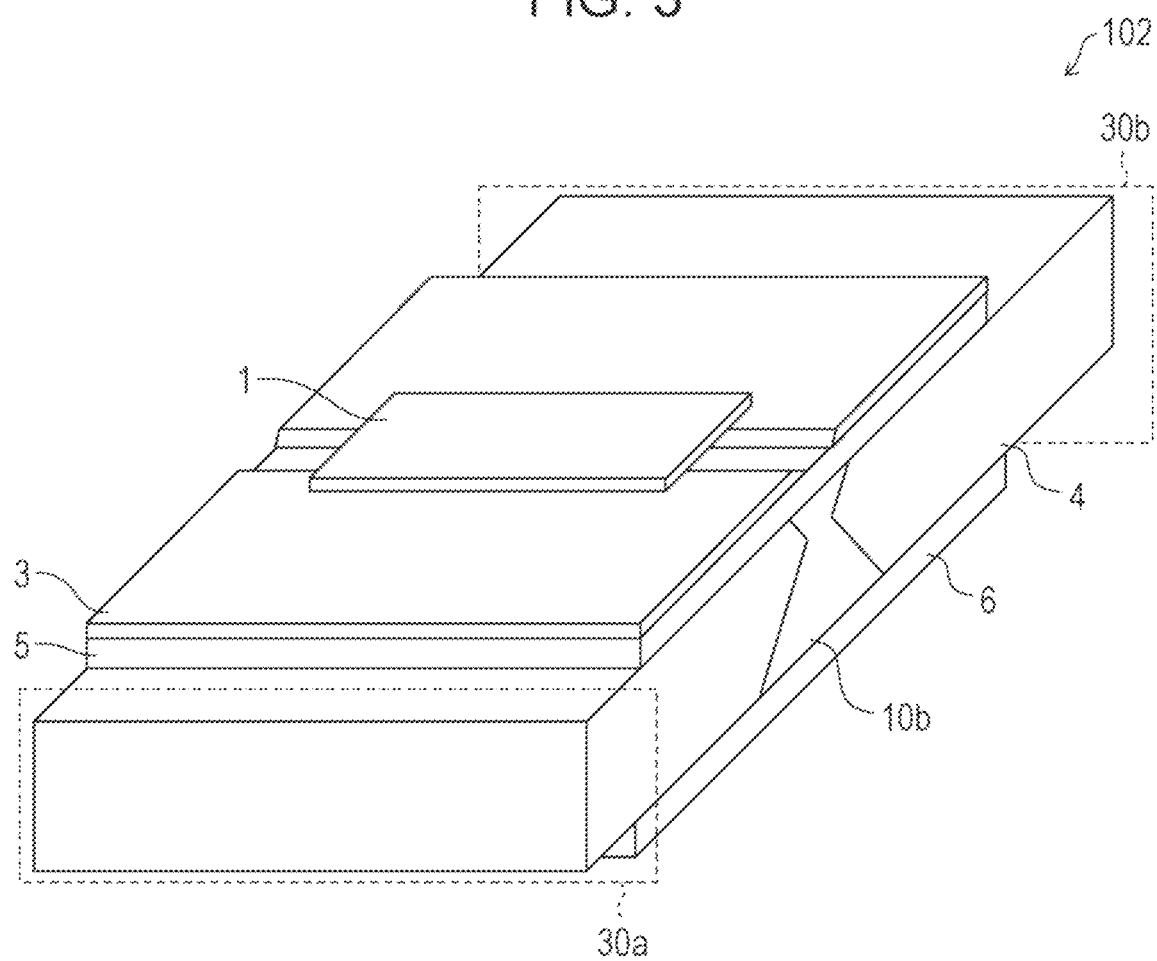
FIG. 3 is a perspective view of a power module according to the third embodiment of the present disclosure.

As illustrated in FIG. 3, a power module 102 according to the third embodiment of the present disclosure is different from the power module 101 according to the second embodiment in that integrated terminal parts (terminal structures) 30a and 30b for connection with an outside are formed in at least parts of a second conductive layer 4. The integrated terminal parts 30a and 30b are collectively referred to as integrated terminal parts 30.

The integrated terminal parts 30 are formed as terminal structures integral with a substrate by removing layers (a first conductive layer 3, a first insulating layer 5, and a second insulating layer 6) other than the second conductive layer 4 from a multilayer substrate, for example, by mechanical polishing. A region where the layers other than the second conductive layer 4 are removed can be any region continuous from an end of the multilayer substrate excluding a region where the power device 1 is disposed and a region where a via 7 is formed in the first insulating layer 5. In other words, the integrated terminal parts 30 can be formed in any size in accordance with a way in which the power module 102 is connected to an outside through the integrated terminal parts 30.

An electric current flowing from the integrated terminal part 30a flows into the power device 1 by passing the second conductive layer 4, the via 7, and the first conductive layer 3 in this order. An electric current that has passed the power device 1 flows out from the integrated terminal part 30b by passing the first conductive layer 3, the via 7, and the second conductive layer 4 again in this order. Conversely, an electric current may flow into the power device 1 from the integrated terminal part 30b, pass the power module 102, and flow out from the integrated terminal part 30a.

According to the above structure, an electric current flows into and out from the integrated terminal parts 30 formed in the second conductive layer 4. This can reduce frequency of flow of an electric current from the first conductive layer 3 to the second conductive layer 4 through the via 7 and reduce resistance of the power module 102 as compared with a case where a terminal is formed in the first conductive layer 3. Although the terminal structure according to the present embodiment is applied to the power module 102 according to the second embodiment, the terminal structure according to the present embodiment may be applied to the power module 100 according to the first embodiment.

Fourth Embodiment

Another embodiment of the present disclosure is described below. For convenience of description, members having functions identical to those of the members described in the above embodiments are given identical reference signs, and repeated description thereof is omitted.

Figure 4:
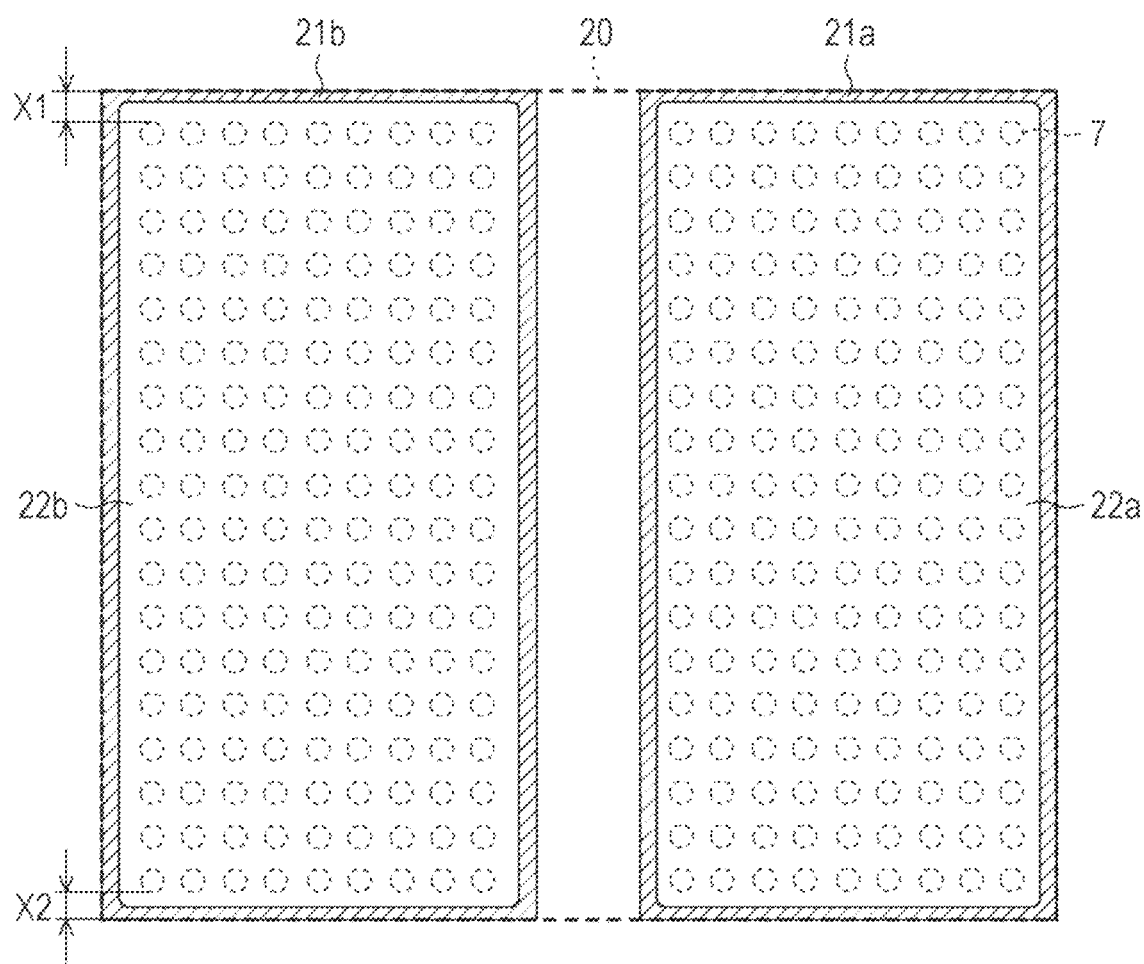
FIG. 4 is a top view illustrating a via installation region of a power module according to the fourth embodiment of the present disclosure.

As illustrated in FIG. 4, the power module 100 according to the first embodiment of the present disclosure is configured such that in a power device mounting region 20 that is a region directly below the power device 1, via installation regions 22a and 22b where the vias 7 are formed are present in the first insulating layer 5 directly below regions (electrode disposition regions) where an electrode 21a and an electrode 21b are connected. A power module according to the fourth embodiment of the present disclosure is different from the power module 100 according to the first embodiment of the present disclosure in that a via 7 is formed close to an end of an electrode disposition region. The following describes an electrode disposition region corresponding to the electrode 21a, but an electrode disposition region corresponding to the electrode 21b also has a similar configuration. The shape of the electrode is not limited to a rectangular shape and can be any shape.

A plurality of vias 7 are formed in the via installation region 22a, and at least one of the vias 7 is formed close to an end of an electrode disposition region. A distance X1 between the end of the electrode disposition region and the at least one of the vias 7 is preferably 0.4 mm or less, more preferably 0.2 mm or less. Furthermore, vias 7 different from the vias 7 that satisfy the distance X1 may be formed close to an end of the electrode disposition region, and a distance X2 between the different vias 7 and the end of the electrode disposition region may be the same as the distance X1 or may be different from the distance X1. In a case where the distance X1 and the distance X2 are different, the distance X2 is preferably 0.4 mm or less, more preferably 0.2 mm or less. The same applies to other vias 7 formed close to an end of the electrode disposition region.

Figure 5:
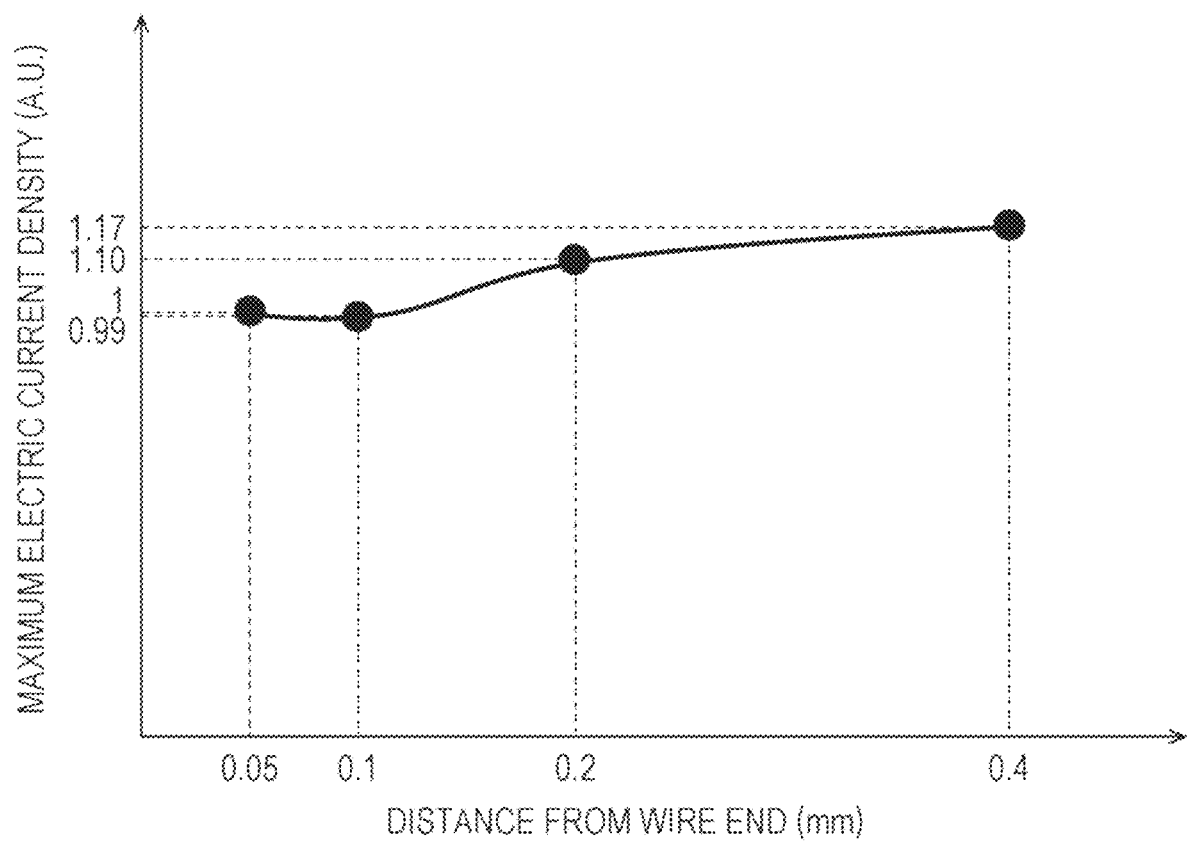
FIG. 5 is a graph illustrating a relationship between a distance from a wire end and a maximum electric current density the power module.

FIG. 5 is a graph illustrating a result of simulation of a relationship between the distance X between the vias 7 and the end (wire end) of the electrode disposition region and a maximum electric current density in the power module according to the present embodiment. In a case where the distance X is in a range from 0.4 mm to 0.1 mm, the maximum electric current density decreases as the distance X becomes shorter. This is because all electric current flowing from an end of the electrode disposition region in the second conductive layer 4 to a via 7 formed close to the end flows so as to concentrate at an end of the via 7 (a part adjacent to the end of the electrode disposition region) and therefore an electric current density becomes high. Therefore, according to the configuration, in a case where a large number of vias 7 are formed in the via installation region 22a, an electric current density in the power module according to the present embodiment can be reduced by forming the vias 7 so that a distance X (a collective term for the distances X1 and X2) between an end of the electrode disposition region and a via 7 close to the end becomes short.

Fifth Embodiment

Another embodiment of the present disclosure is described below. For convenience of description, members having functions identical to those of the members described in the above embodiments are given identical reference signs, and repeated description thereof is omitted.

Figure 6:
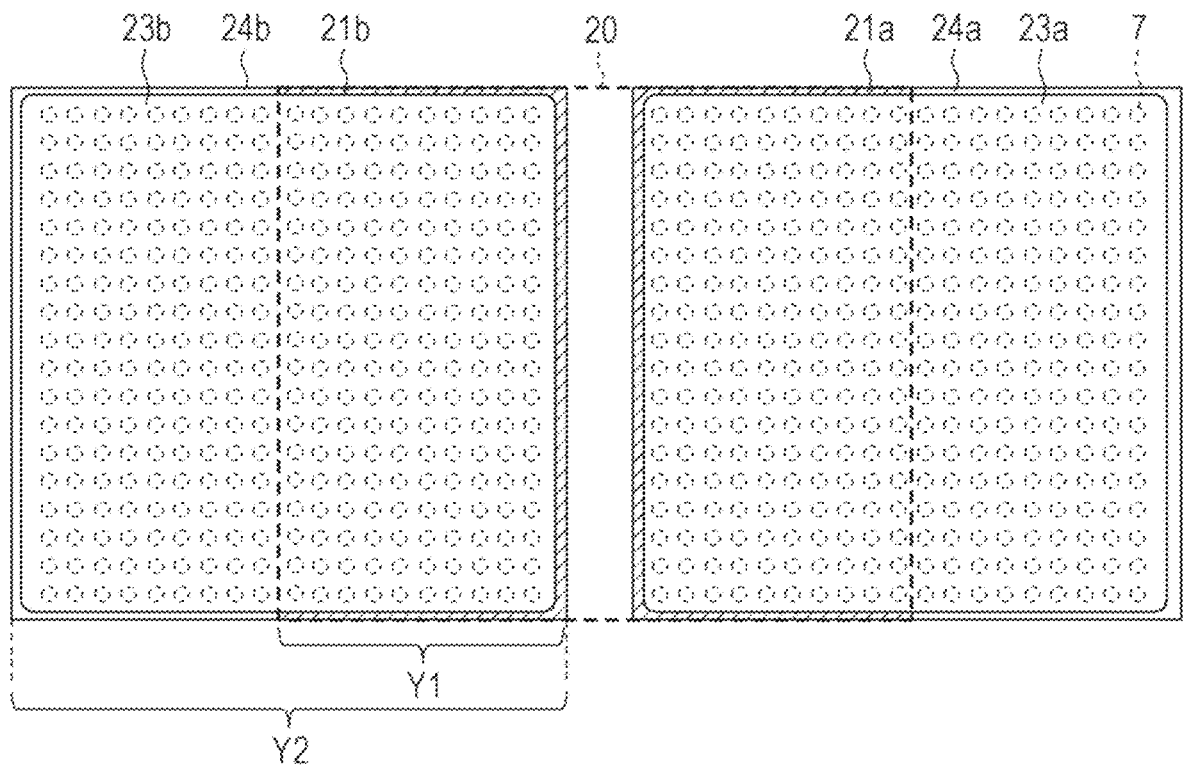
FIG. 6 is a to view illustrating a via installation region of a power module according to the fifth embodiment of the present disclosure.

As illustrated in FIG. 6, a power module 110 (see FIG. 13) according to the fifth embodiment of the present disclosure is different from the power module 100 according to the first embodiment of the present disclosure in that via installation regions 23a and 23b are formed in first conductive layer wire parts (via formation regions) 24a and 24b including electrode disposition regions and regions outside the electrode disposition regions. The following describes an electrode region corresponding to the electrode 21a, but an electrode region corresponding to the electrode 21b also has a similar configuration. The shape of the electrode is not limited to a rectangular shape and can be any shape.

A large number of vias 7 are also formed in a region outside a power device mounting region 20. In this case, a length Y2 of the first conductive layer wire part 24a in a longitudinal direction of the power module 110 according to the present embodiment is preferably 1.5 or more times as large as a length Y1 of the electrode disposition region corresponding to the electrode 21a in the longitudinal direction.

According to the configuration, an electric current can pass the vias 7 formed in the region outside the power device mounting region 20, and therefore an electric current density of the power module 110 according to the present embodiment can be reduced.

Figure 7:
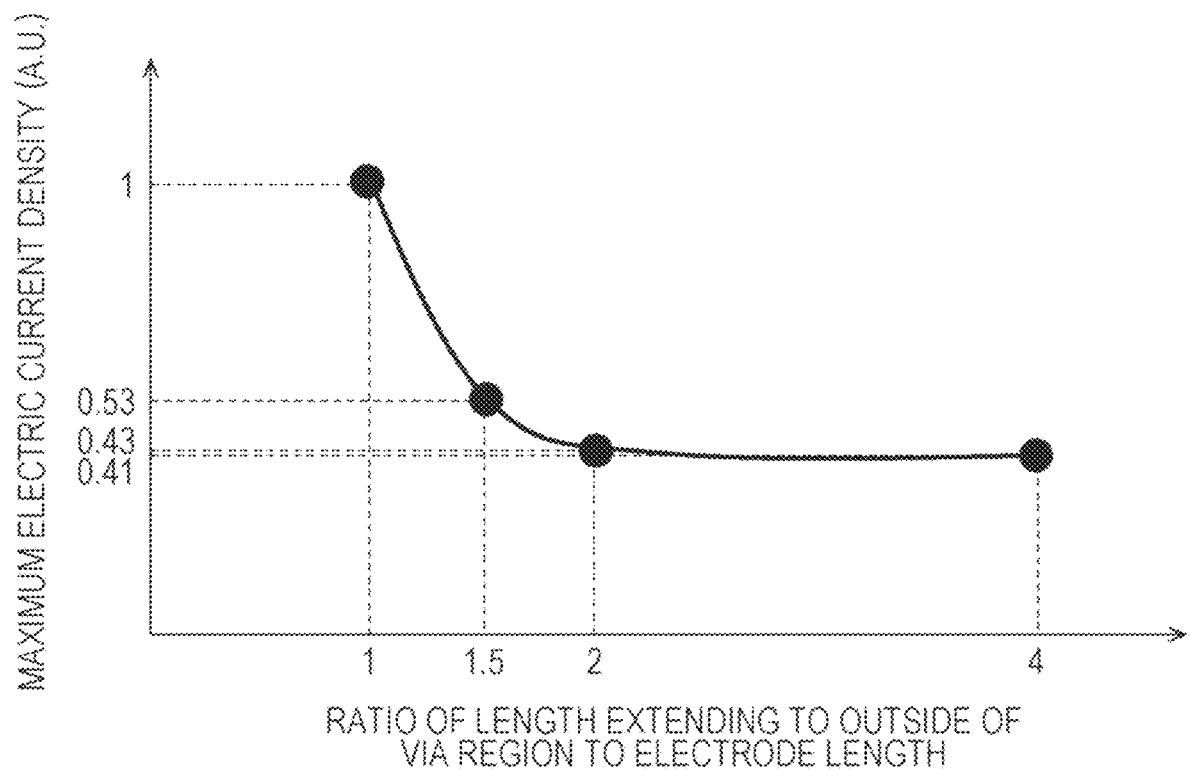
FIG. 7 is a graph illustrating a relationship between a ratio of a length extending to an outside of a via region to an electrode length and a maximum electric current density in the power module.

FIG. 7 is a graph illustrating a result of simulation of a relationship between a ratio (the length Y2/the length Y1) of a length (the length Y2) extending to an outside of a via region to an electrode length (the length Y1) and a maximum electric current density in the power module 110 according to the present embodiment. The maximum electric current density markedly decreases as the ratio of the length Y2 to the length Y1 becomes larger. When the ratio of the length Y2 to the length Y1 reaches 2, the effect of decreasing the maximum electric current density is limited thereafter for the following reason. When an electric current flows from a second conductive layer 4 into a power device 1 by passing the vias 7, a first conductive layer 3, and solder 2, the electric current is split in accordance with resistance of each electric current path. However, an electric current path for an electric current passing a via 7 located away from the solder 2 has large resistance because a distance thereof passing the first conductive layer 3 becomes long, and therefore an amount of electric current flowing this electric current path becomes small. For this reason, it is considered that the effect of decreasing an electric current density is limited even in a case where a via 7 is formed in a region where the ratio of the length Y2 to the length Y1 is 2 or more.

Modification

Configuration of Power Module

Figure 13A:
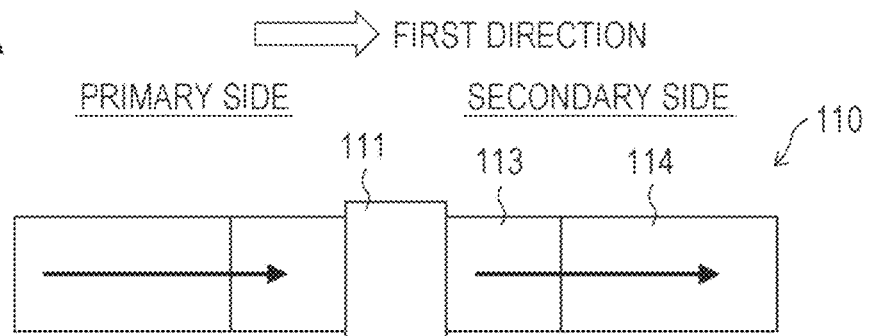
FIG. 13A is a plan view illustrating an electric current path of a power module according to the fifth embodiment of the present disclosure.
Figure 13B:
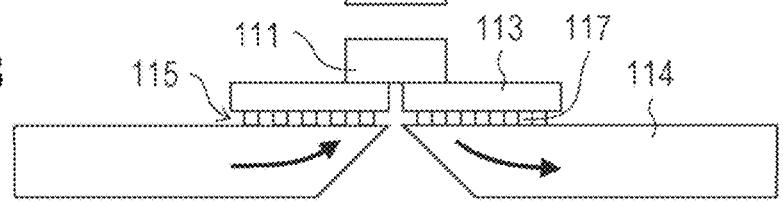
FIG. 13B is a cross-sectional view illustrating the electric current path of the power module.
Figure 13C:
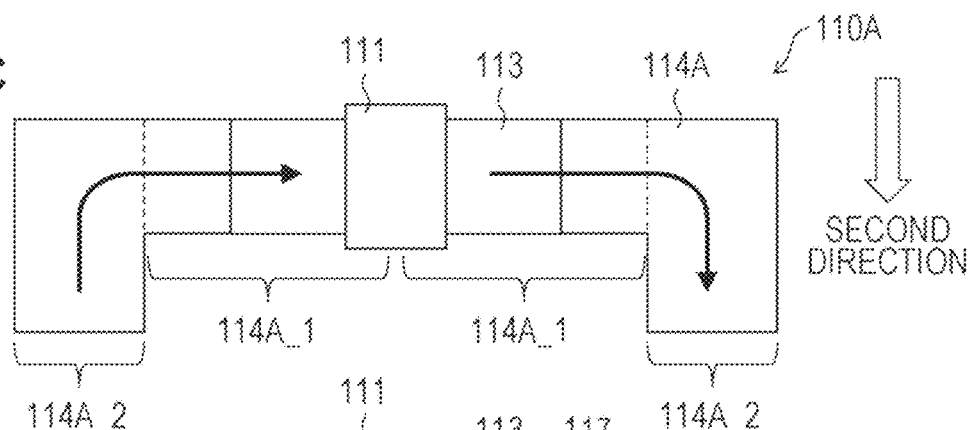
FIG. 13C is a plan view illustrating an electric current path of a modification of the power module.
Figure 13D:
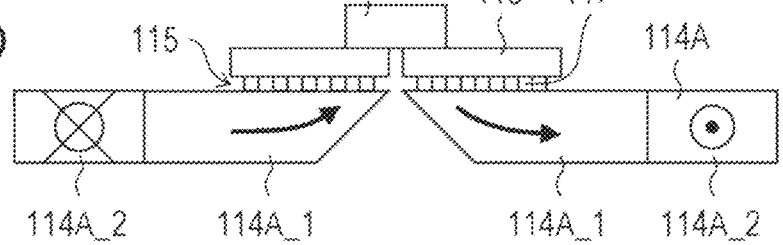
FIG. 13D is a cross-sectional view illustrating the electric current path of the modification of the power module.

A modification of the fifth embodiment is described below. A 13A is a plan view illustrating an electric current path of the power module 110 according to the fifth embodiment of the present disclosure, and FIG. 13B is a cross-sectional view illustrating the electric current path of the power module 110. FIG. 13C is a plan view illustrating an electric current path of a power module 110A that is a modification of the power module 110, and FIG. 13D is a cross-sectional view illustrating the electric current path of the power module 110A. In FIGS. 13A through 13D and subsequent drawings, a SW element 111, a front surface wire 113, back surface wires 114 and 114A, and vias 117 correspond to the power device 1, the first conductive layer 3, the second conductive layer 4, and the vias 7 in FIG. 1, respectively, and SW element electrodes 118 in FIGS. 15A and 15B correspond to the electrodes 21a and 21b in FIG. 4. In the description of the present modification, an up-down direction is illustrated assuming that a side on which the SW element 111 is disposed relative to the back surface wire 114A is an upper side. Note that the up-down direction illustrated below is for convenience of description, and the present disclosure may be used in a direction other than this direction.

The power module 110A is different from the power module 110 in that the power module 110A includes the back surface wire 114A instead of the back surface wire 114. Specifically, the back surface wire 114 of the power module 110 has a shape extending in a direction (a first direction, indicated by the white arrow in FIG. 13A) parallel with a multilayer substrate surface. Accordingly, an electric current path of the power module 110 is linear in plan view and is curved toward the SW element 111 through the vias 117 in cross-sectional view as indicated by the back arrows in FIGS. 13A and 13B.

Meanwhile, the back surface wire 114A of the power module 110A has a first region 114A_1 that extends in the first direction and a second region 114A_2 that extends in a second direction (the white arrow in FIG. 13C) different from the first direction and is adjacent to the first region 114A_1. In other words, the back surface wire 114A is not linear but is curved in the power module 110A. Accordingly, an electric current path of the power module 110A is curved in plan view and is curved toward the SW element 111 through the via 117 in cross-sectional view as indicated by the black arrows in FIGS. 13C and 13D.

Figure 14A:
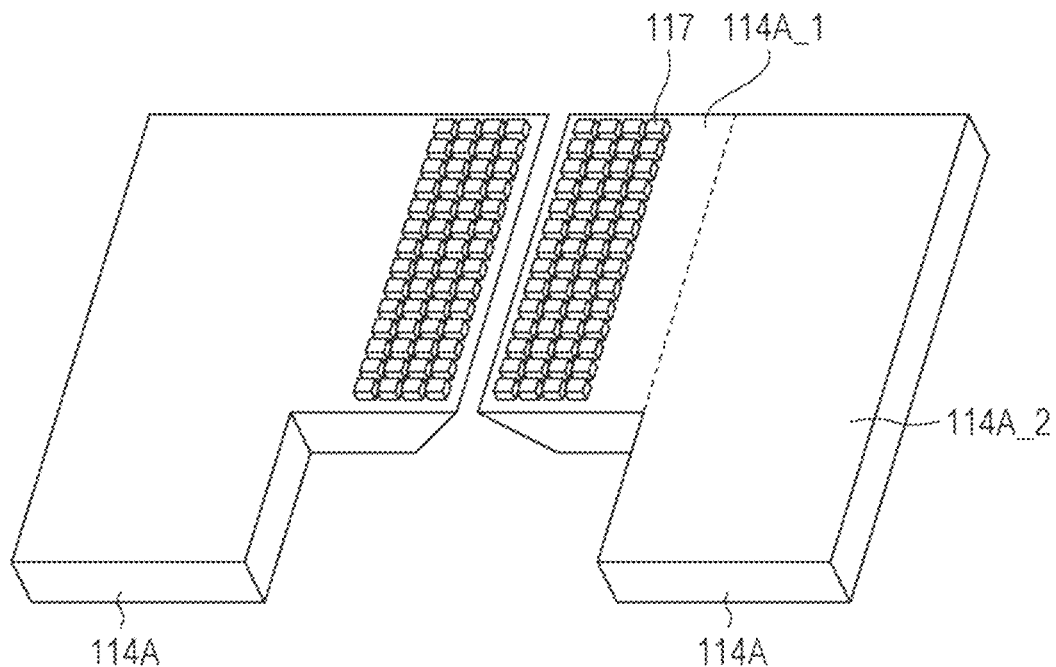
FIG. 14A is a bird's eye view illustrating a back surface wire and vias in the power module and FIG. 14B is a bird's eye view illustrating a range from the back surface wire to a front surface wire in the power module.
Figure 14B:
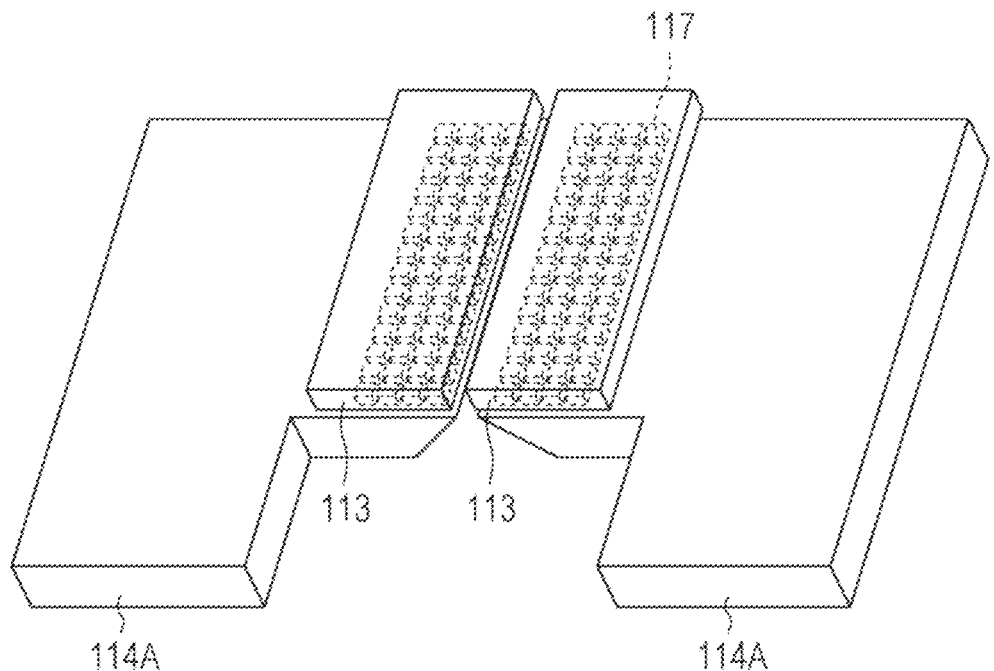
Figure 15A:
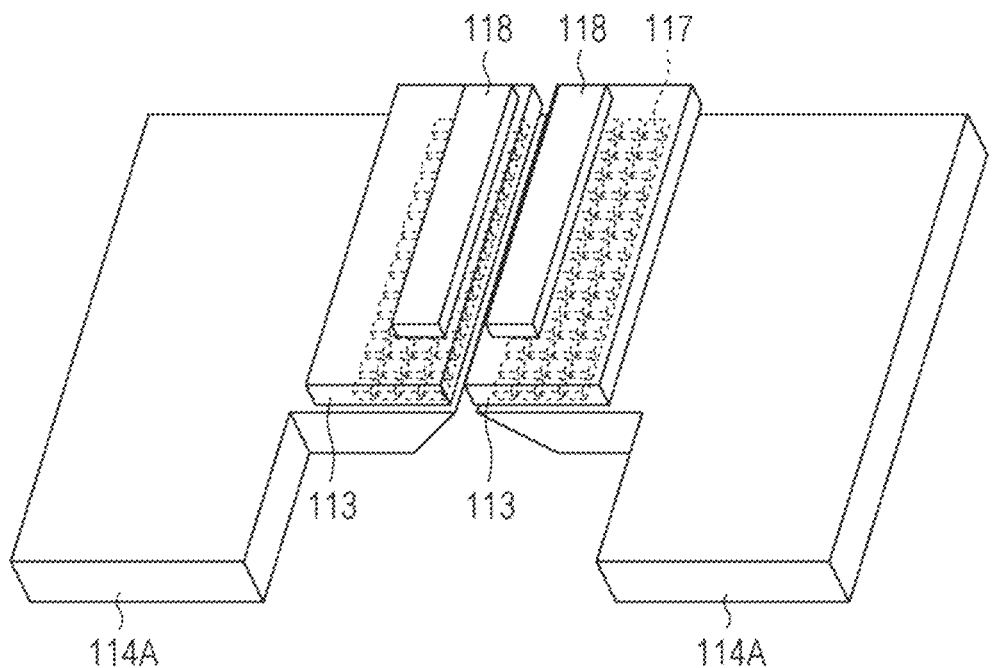
FIG. 15A is a bird's eye view illustrating a range from the back surface wire to SW element electrodes in the power module and FIG. 15B is a bird's eye view illustrating a range from the back surface wire to an SW element in the power module.
Figure 15B:
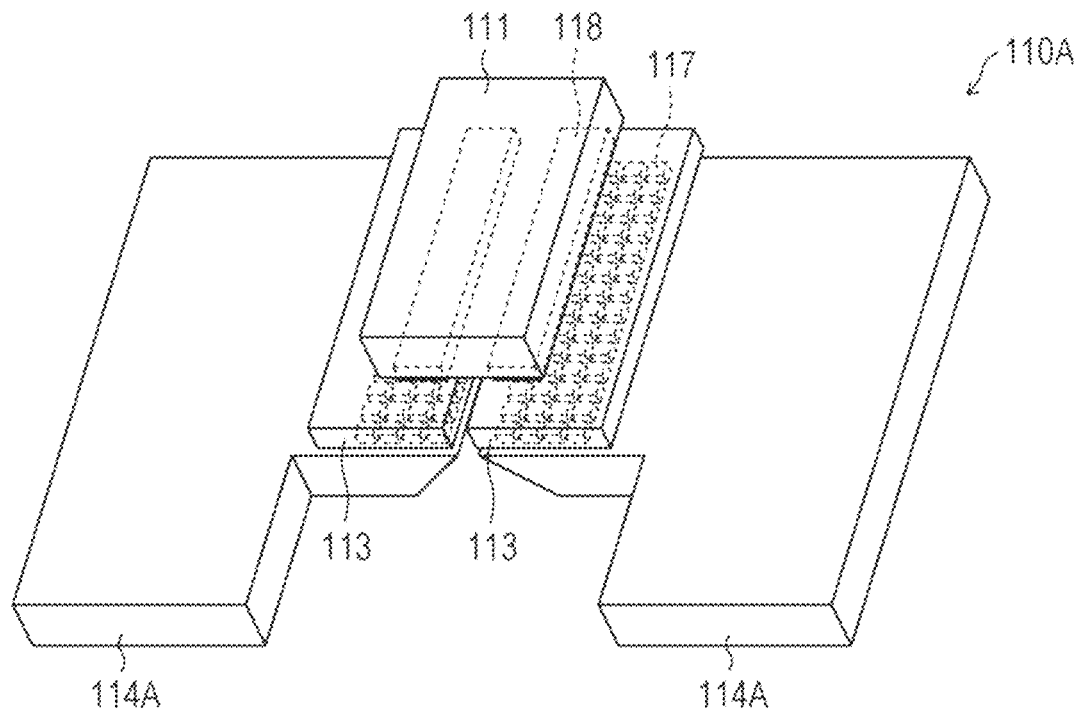

FIGS. 14 and 15 illustrate a configuration of the power module 110A in more detail. In FIGS. 14 and 15, the vias 117 are illustrated as cubes for easy understanding of the shape of the vias 117. FIG. 14A is a bird's-eye view illustrating the back surface wire 114A and the vias 117 in the power module 110A. FIG. 14B is a bird's-eye view illustrating a range from the back surface wire 114A to the front surface wire 113 in the power module 110A. FIG. 15A is a bird's-eye view illustrating a range from the back surface wire 114A to the SW element electrodes 118 in the power module 110A. FIG. 15B is a bird's-eye view illustrating a range from the back surface wire 114A to the SW element 111 in the power module 110A. As illustrated in FIGS. 14A and 14B and FIGS. 15A and 15B, the power module 110A is configured such that the back surface wire 114A, the vias 117, and the front surface wire 113 are stacked in this order from a lower side and the SW element electrodes 118 and the SW element 111 are further disposed.

Via Layout

Figure 16:
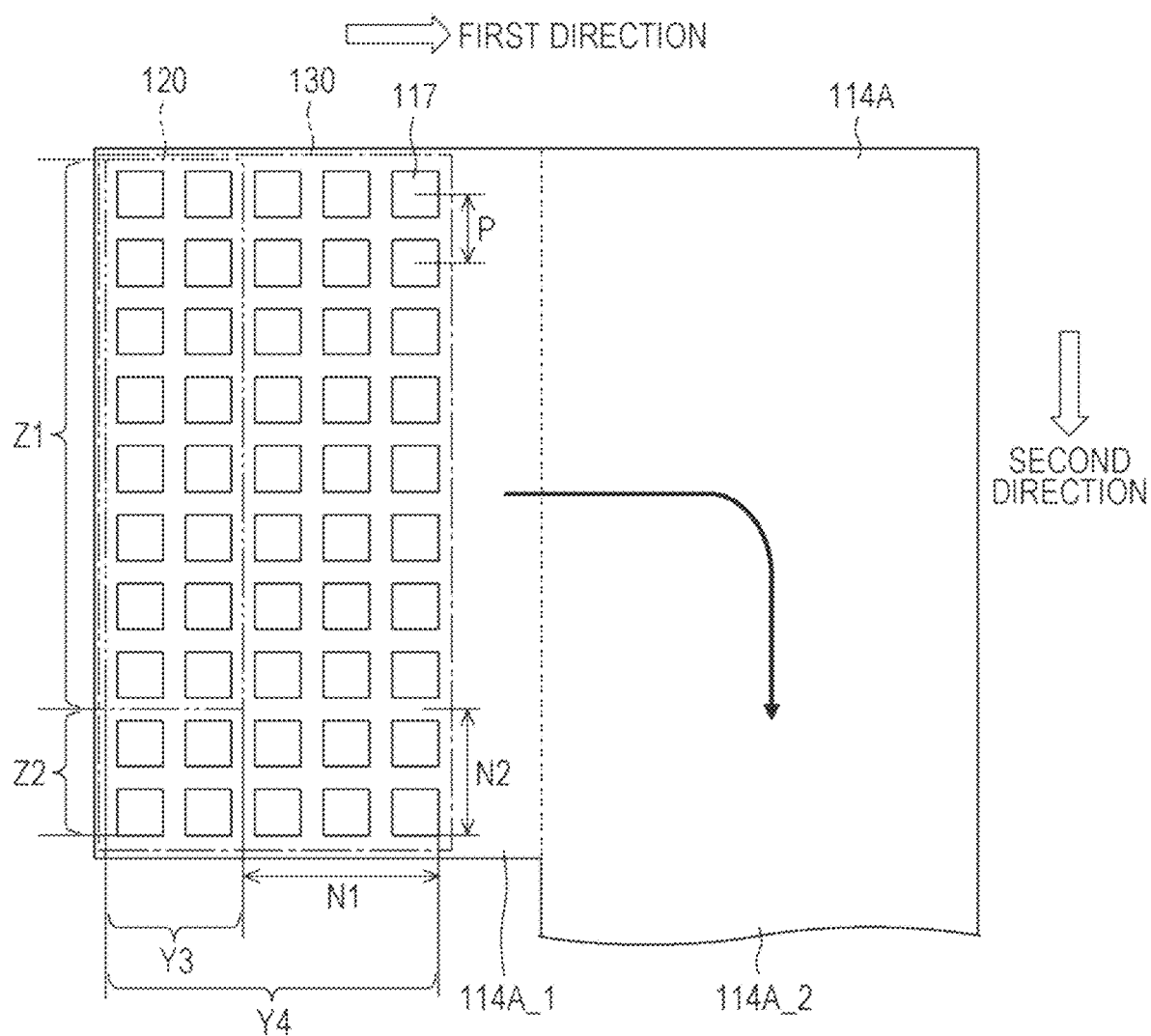
FIG. 16 is a plan view for explaining layout of vias of the power module.

As illustrated in rig. 13D, the power module 110A is configured such that a plurality of vias 117 are disposed in the first insulating layer 115 directly below the SW element electrodes 118. As illustrated in FIG. 16, the plurality of vias 117 are formed in the first insulating layer 115 so as to be located in a via formation region 130 including an electrode disposition region 120 in which the SW element electrodes 118 that connect the SW element 111 and the front surface wire 113 are disposed and a region outside the electrode disposition region 120. FIG. 16 is a plan view for explaining layout of the vias 117 of the power module 110A. The electrode disposition region 120 corresponds to a range in which the SW element electrodes 118 are projected onto the vias 117. Although only a secondary side of the power module 110A is illustrated in FIGS. 16 through 18, a primary side also has a similar configuration.

As illustrated in FIG. 16, the power module 110A is configured such that a length Y4 of the via formation region 130 in a direction (the first direction) parallel with the substrate surface is 1.5 or more times as large as a length Y3 of the electrode disposition region 120 in the first direction. Furthermore, a length Z2, in the second direction, of a part of the via formation region 130 outside the electrode disposition region 120 is 0.5 or more times as large as the length Y3 of the electrode disposition region 120 in the first direction.

Figure 17:
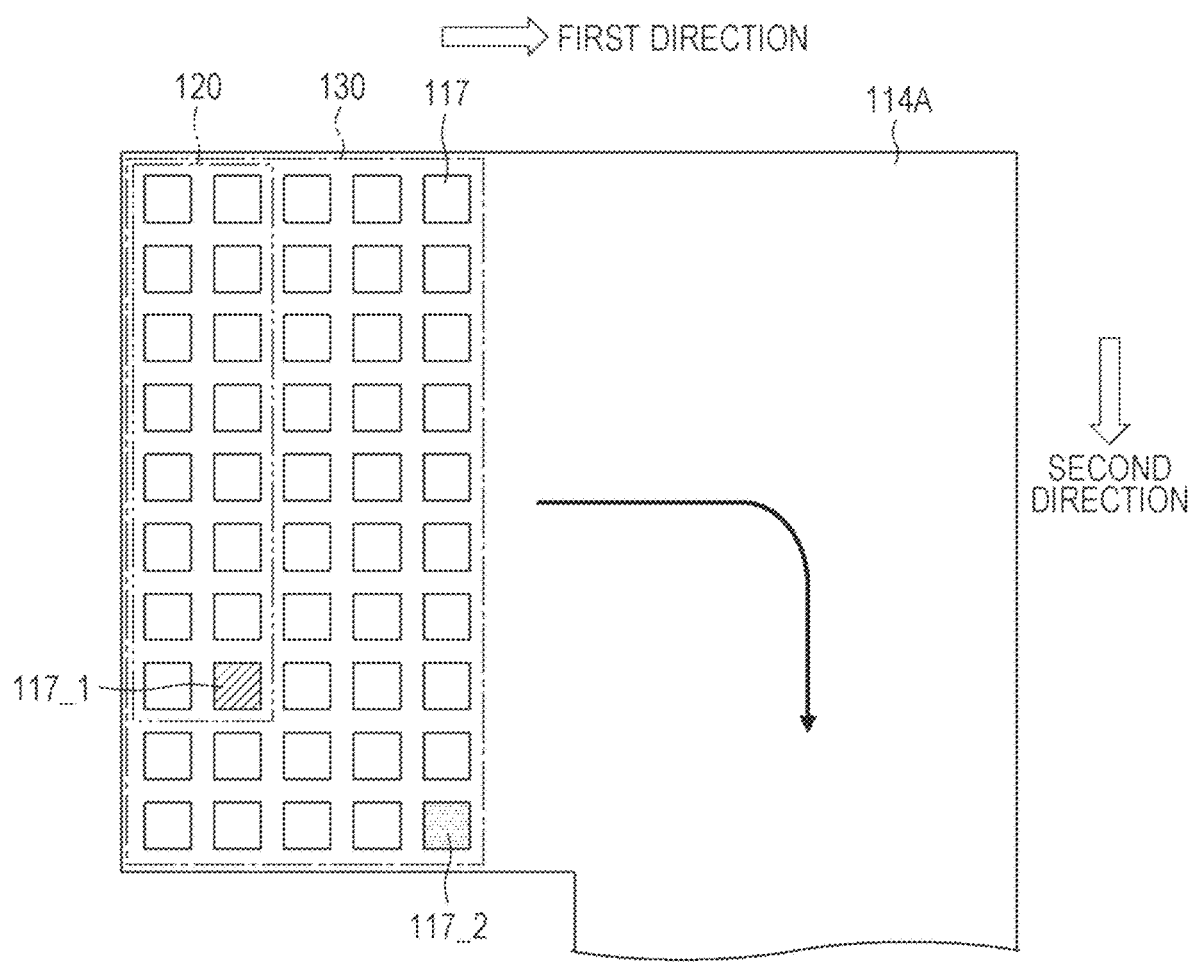
FIG. 17 is a view illustrating a via at which an electric current is concentrated in the power module.

FIG. 17 illustrates a via 117 at which an electric current concentrates in the power module 110A. As illustrated in FIG. 17, in a case where an electric current is passed through the power module 110A in which the back surface wire 114A is curved from the first direction to the second direction, the electric current is most concentrated at a via 117_1 located at a front end of the electrode disposition region 120 in a direction (indicated by the back arrow) of flow of the electric current. Furthermore, outside the electrode disposition region 120, the electric current is most concentrated at a via 117_2 located at a front end of the via formation region 130 in the direction of flow of the electric current. According to the power module 110A, it is possible to mitigate concentration of an electric current at such current concentrated parts and to reduce an electric current density.

Figure 18A:
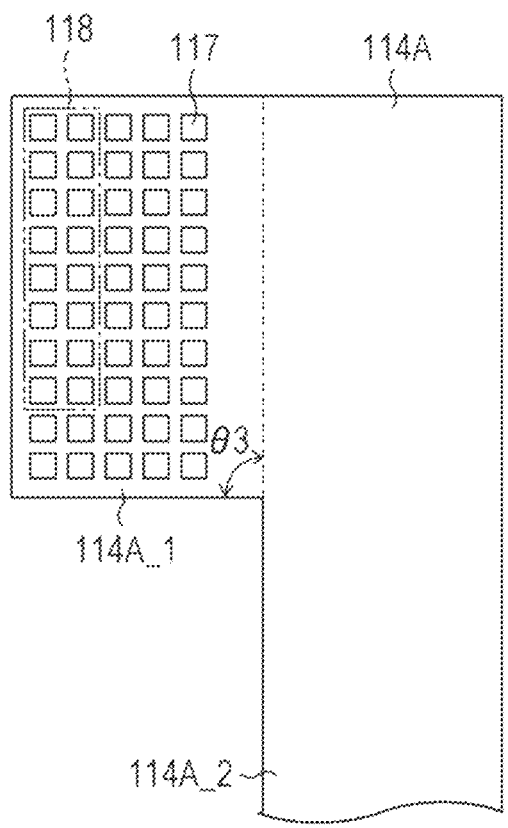
FIGS. 18A and 18B are views illustrating an example of a way in which the back surface wire of the power module is curved.
Figure 18B:
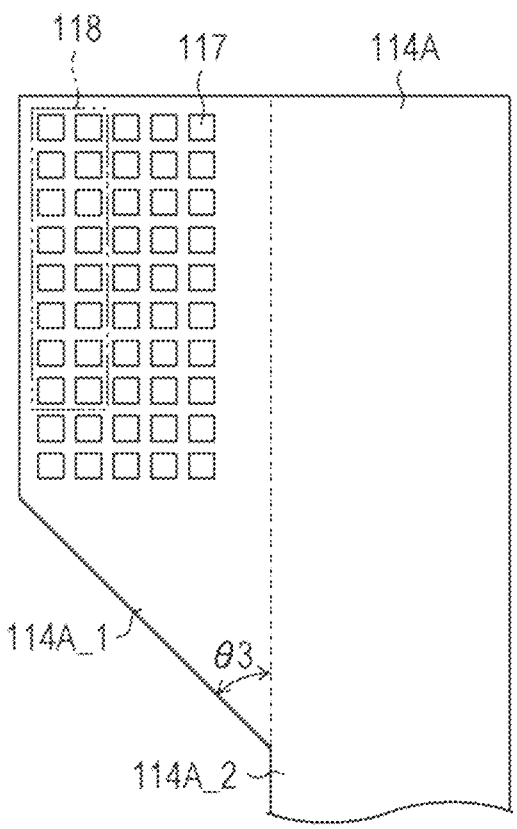

The above effect is described below with reference to FIGS. 18 through 22. FIGS. 18A and 18B illustrate an example of a way in which the back surface wire 114A of the power module 110A is curved. As illustrated in FIG. 18A, the power module 110A may be configured such that the back surface wire 114A is curved so that an angle θ3 formed between the first region 114A_1 and the second region 114A_2 of the back surface wire 114A is π/2. Furthermore, as illustrated in FIG. 18B, the power module 110A may be configured such that the back surface wire 114A is curved so that the angle θ3 formed between the first region 114A_1 and the second region 114A_2 of the back surface wire 114A is π/4. In other words, the back surface wire 114A is formed so that the angle θ3 formed between the first region 114A_1 and the second region 114A_2 satisfies π/4<θ3<π/2.

Figure 19A:
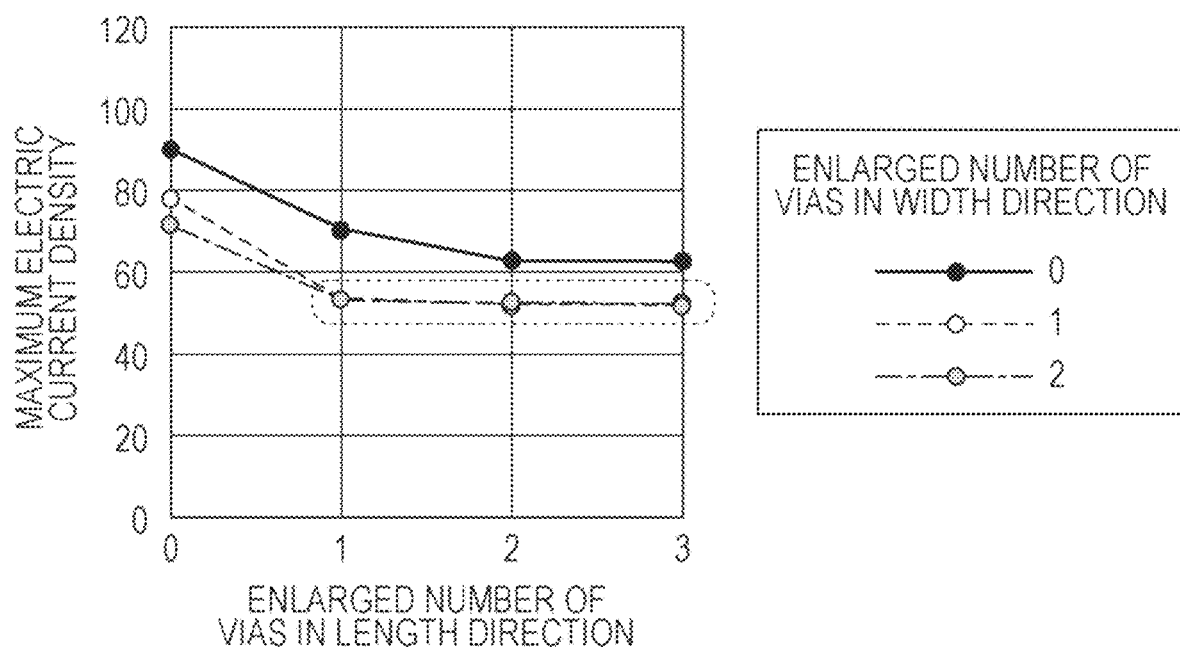
FIGS. 19A and 19B are graphs illustrating a relationship between the enlarged number of vias and a maximum electric current density in a case where a via pitch is ½ of a SW element electrode length in the power module.
Figure 19B:
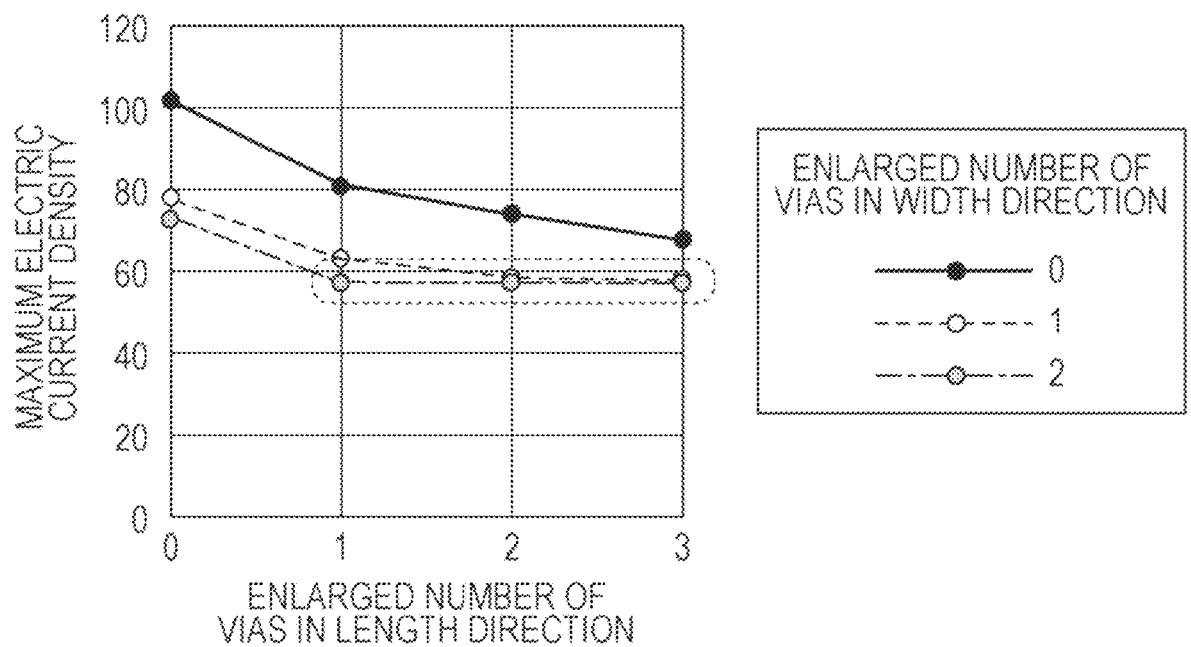

FIG. 19 is a graph illustrating a relationship between the enlarged number of vias and a maximum electric current density in a case where a via pitch P is ½ of the SW element electrode length Y3 in the power module 110A. FIG. 19A illustrates a case where the angle θ3 is π/2, and FIG. 19B illustrates a case where the angle θ3 is π/4. The via pitch P in FIGS. 19 through 22 is a distance (see FIG. 16) between a center of a via 117 and a center of an adjacent via 117. The "enlarged number of vias" in FIGS. 19A and 19B is the number of vias disposed in a length direction (the first direction) and a width direction (the second direction) in the via formation region 130 outside the electrode disposition region 120. Specifically, N1 illustrated in FIG. 16 is the enlarged number of vias in the length direction, and N2 is the enlarge number of vias in the width direction.

As illustrated in FIGS. 19A and 19B, electric power concentration is mitigated by enlarging the number of vias 117 by one or more vias 117 in the width direction and one or more vias 117 in the length direction both in the case where the angle θ3 is π/2 and the case where the angle θ3 is π/4, and the electric power concentration is not mitigated any more even if the number of vias 117 is enlarged further.

Figure 20:
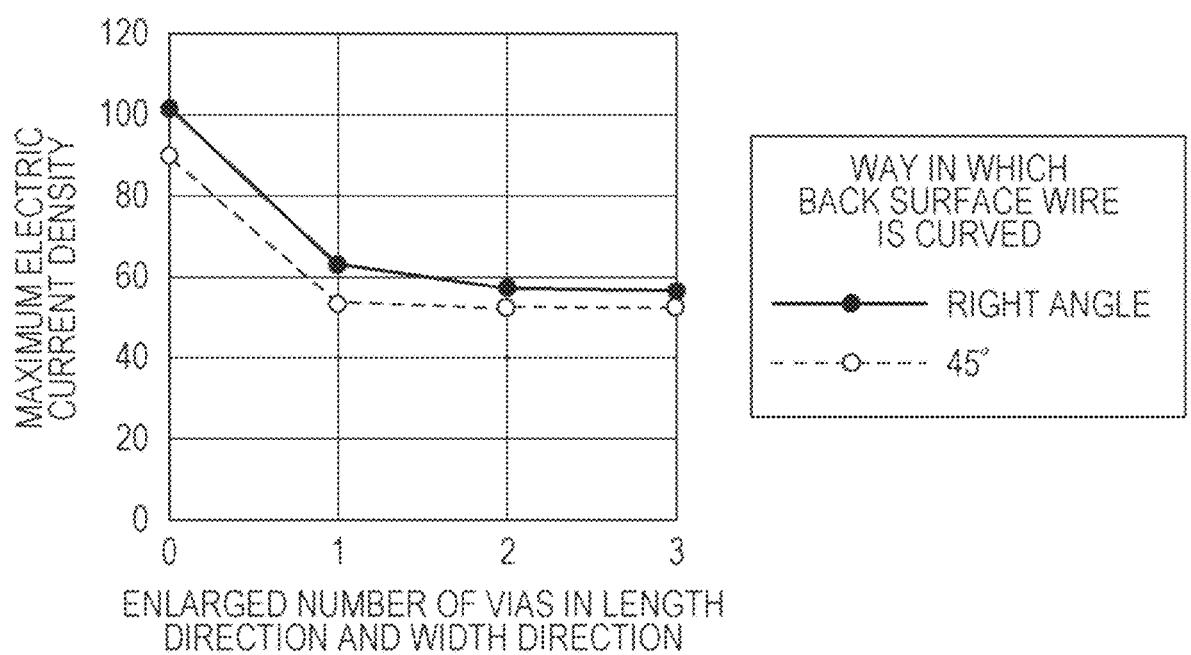
FIG. 20 is a graph illustrating a relationship between the enlarged number of vias and a maximum electric current density in a case where a via pitch is ½ of a SW element electrode length in the power module and illustrates a case where the enlarged number of vias in a length direction and the enlarged number of vias in a width direction are the same.

FIG. 20 is a graph illustrating a relationship between the enlarged number of vias and a maximum electric current density in a case where the via pitch P is ½ of the SW element electrode length Y3 in the power module 110A and illustrates a case where the enlarged number of vias in the length direction and the enlarged number of vias in the width direction are the same (case where N1=N2). As illustrated in FIG. 20, electric power concentration is mitigated by enlarging the number of vias 117 by one or more vias 117 in the length direction and the width direction irrespective of the angle θ3, and the electric power concentration is not mitigated any more even if the number of vias 117 is enlarged further. That is, in a case where the via pitch P is ½ of the SW element electrode length Y3, electric power concentration is mitigated when N1 is equal to or larger than 1 and N2 is equal to or larger than 1.

Figure 21A:
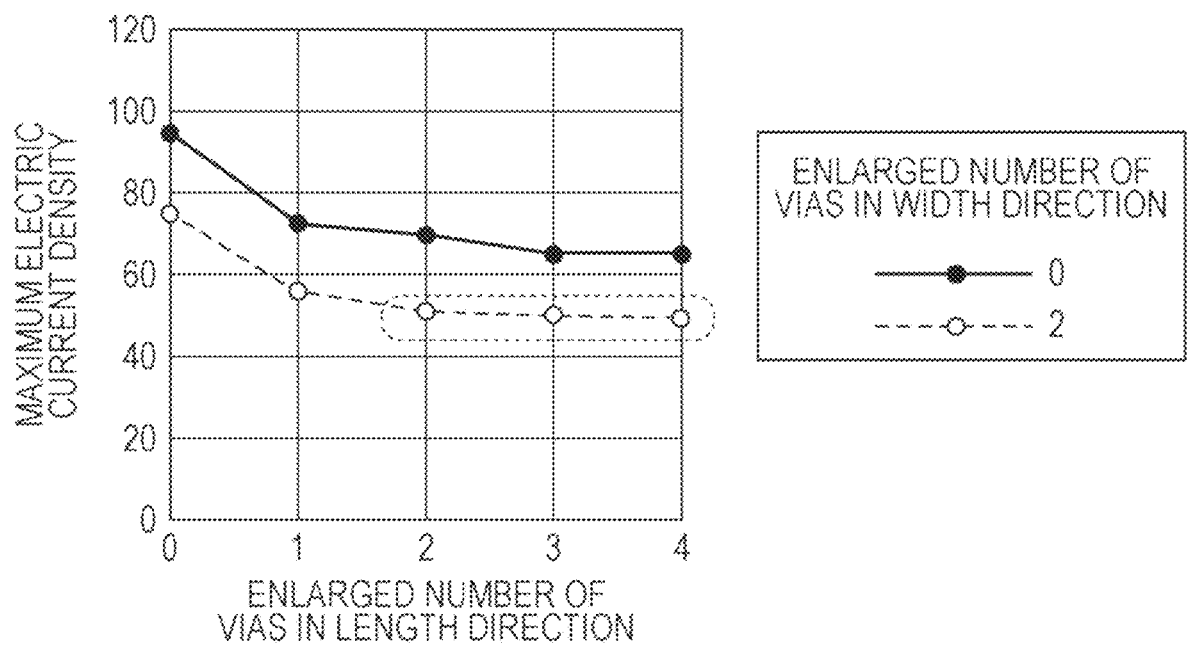
FIGS. 21A and 21B are graphs illustrating a relationship between the enlarged number of vias and a maximum electric current density in a case where a via pitch is ¼ of a SW element electrode length in the power module and FIG. 21A illustrates a case where an angle θ3 is π/2 and FIG. 21B illustrates a case where the angle θ3 is π/4.
Figure 21B:
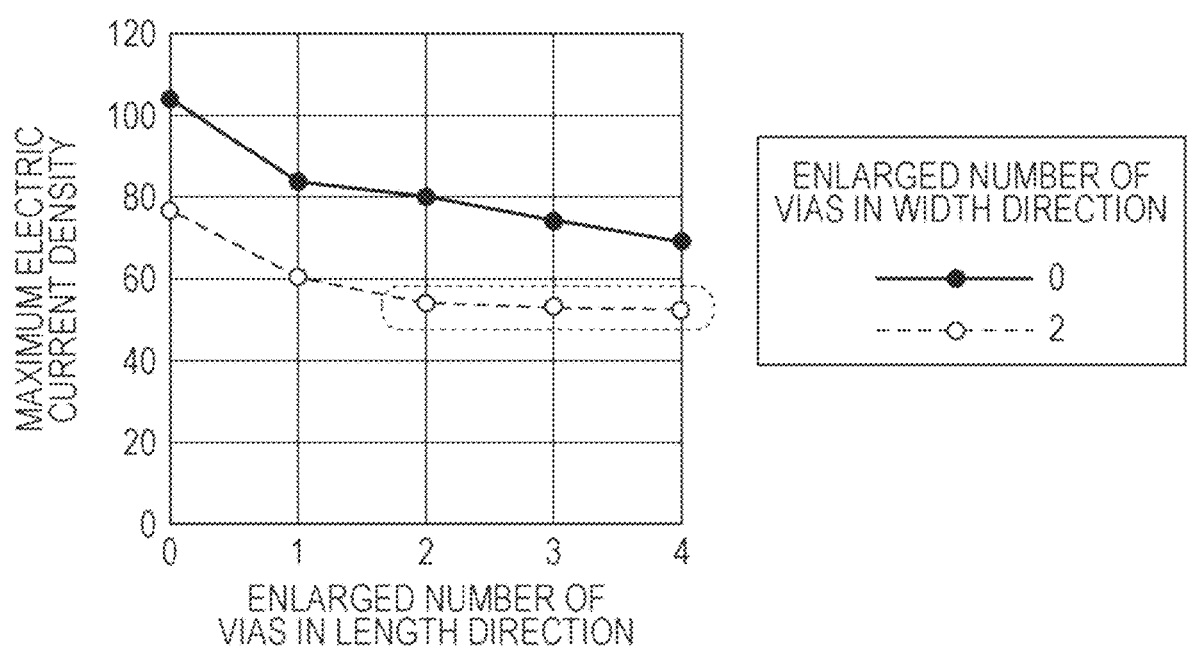

FIG. 21 is a graph illustrating a relationship between the enlarged number of vias and a maximum electric current density in a case where the via pitch P is ¼ of the SW element electrode length Y3 in the power module 110A. FIG. 21A illustrates a case where the angle θ3 is π/2, and FIG. 21B illustrates a case where the angle θ3 is π/4. As illustrated in FIGS. 21 and 21B, electric power concentration is mitigated by enlarging the number of vias 117 by two or more vies 117 in the width direction and two or more vias 117 in the length direction in the cases where the angle θ3 is π/2 and π/4, and the electric power concentration is not mitigated any more even if the number of vias 117 is enlarged further.

Figure 22:
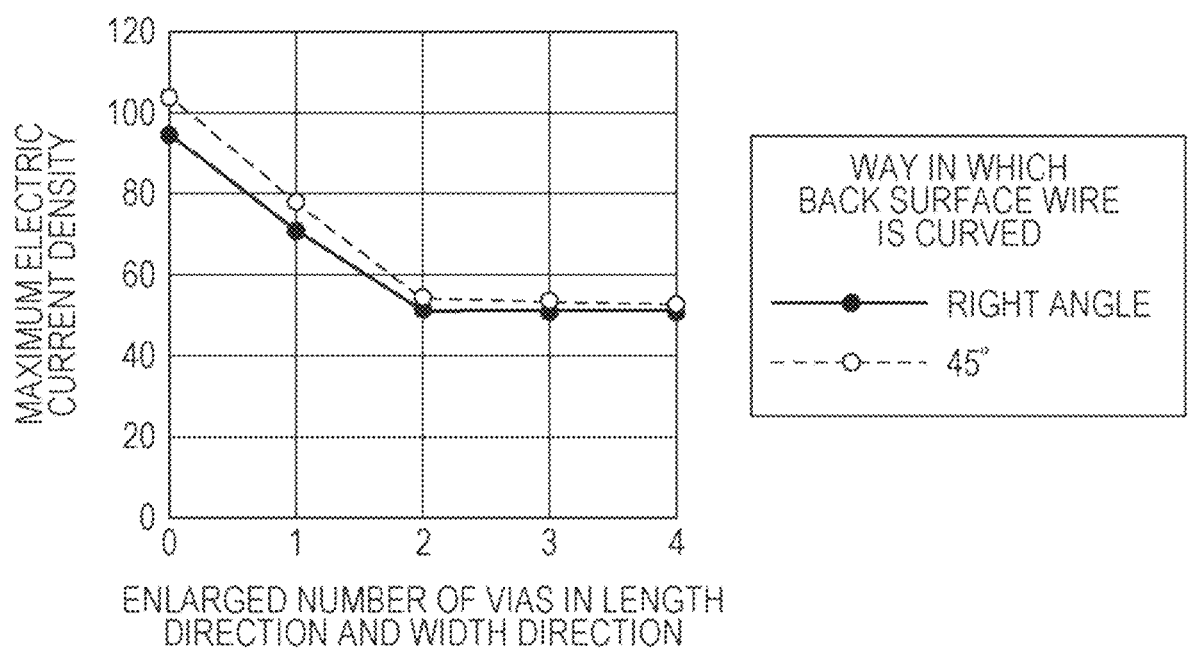
FIG. 22 is a graph illustrating a relationship between the enlarged number of vias and a maximum electric current density in a case where a via pitch is ¼ of a SW element electrode length in the power module and illustrates a case where the enlarged number of vias in a length direction and the enlarged number of vias in a width direction are the same.

FIG. 22 is a graph illustrating a relationship between the enlarged number of vias and a maximum electric current density in a case where the via pitch P is ¼ of the SW element electrode length Y3 in the power module 110A and illustrates a case where the enlarged number of vias in the length direction and the enlarged number of vias in the width direction are the same. As illustrated in FIG. 22, electric power concentration is mitigated by enlarging the number of vias 117 by two or more vias 117 irrespective of the angle θ3, and the electric power concentration is not mitigated any more even if the number of vias 117 is enlarged further. That is, in a case where the via pitch P is ¼ of the SW element electrode length Y3, electric power concentration is mitigated when N1 is equal to or larger than 2 and N2 is equal to or larger than 2.

As described above, according to the power module 110A, it is possible to mitigate electric current concentration at such current concentration parts and to reduce an electric current density.

Sixth Embodiment

Another embodiment of the present disclosure is described below. For convenience of description, members having functions identical to those of the members described in the above embodiments are given identical reference signs, and repeated description thereof is omitted.

Figure 8:
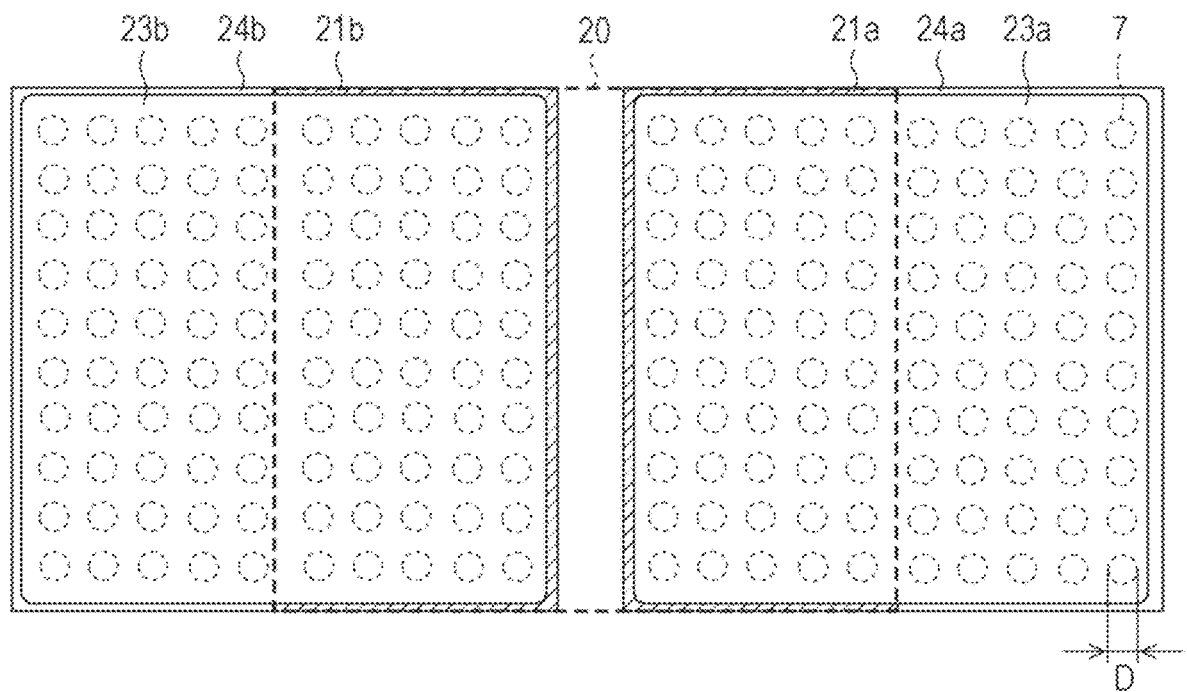
FIG. 8 is a top view illustrating a via installation region of a power module according to the sixth embodiment of the present disclosure.

As illustrated in FIG. 8, a power module according to the sixth embodiment of the present disclosure is different from the power module 100 according to the first embodiment of the present disclosure in that a diameter D of vias 7 formed in via installation regions 23a and 23b is 0.1 mm to 0.4 mm. A shape of an electrode is not limited to a rectangular shape and can be any shape.

In the power module according to the present embodiment, a plurality of vias 7 are preferably formed in a grid manner in the via installation regions 23a and 23b. In a case where the vias 7 are formed in this way, the diameter D of the vias 7 is preferably 0.1 mm to 0.4 mm, more preferably 0.15 mm to 0.3 mm, further more preferably 0.2 mm.

According to the configuration, concentration of an electric current flowing between two specific vias 7 at opposing ends of the two specific vias 7 is suppressed. It is therefore to reduce an electric current density in the power module according to the present embodiment.

Figure 9:
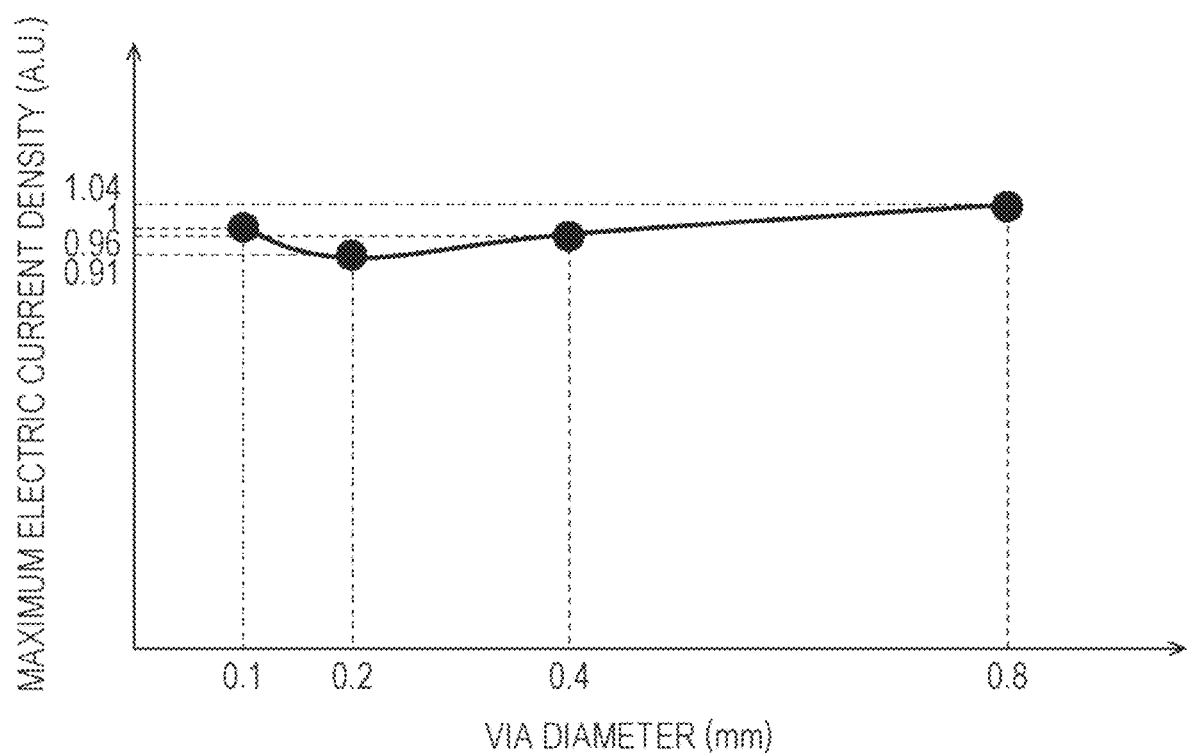
FIG. 9 is a graph illustrating a relationship between a via diameter and a maximum electric current density in the power module.

FIG. 9 is a graph illustrating a result of simulation of a relationship between the diameter D (via diameter) of the vias 7 and a maximum electric current density in the power module according to the present embodiment. In this simulation, the maximum electric current density is smallest in a case where the diameter D is 0.2 mm, and the maximum electric current density increases as the diameter D becomes larger from 0.2 mm. That is, by setting the diameter D to nearly 0.2 mm, an electric current density in the power module according to the present embodiment can be reduced.

Simulation Result

As illustrated in FIG. 1, the power module 100 according to the first embodiment of the present disclosure is configured such that the angle θ is 45 degrees, a length of the solder 2 in a horizontal direction is 0.8 mm, a thickness of the first conductive layer 3 is 0.14 mm, and a thickness of the second conductive layer 4 is 1 mm.

Figure 12:
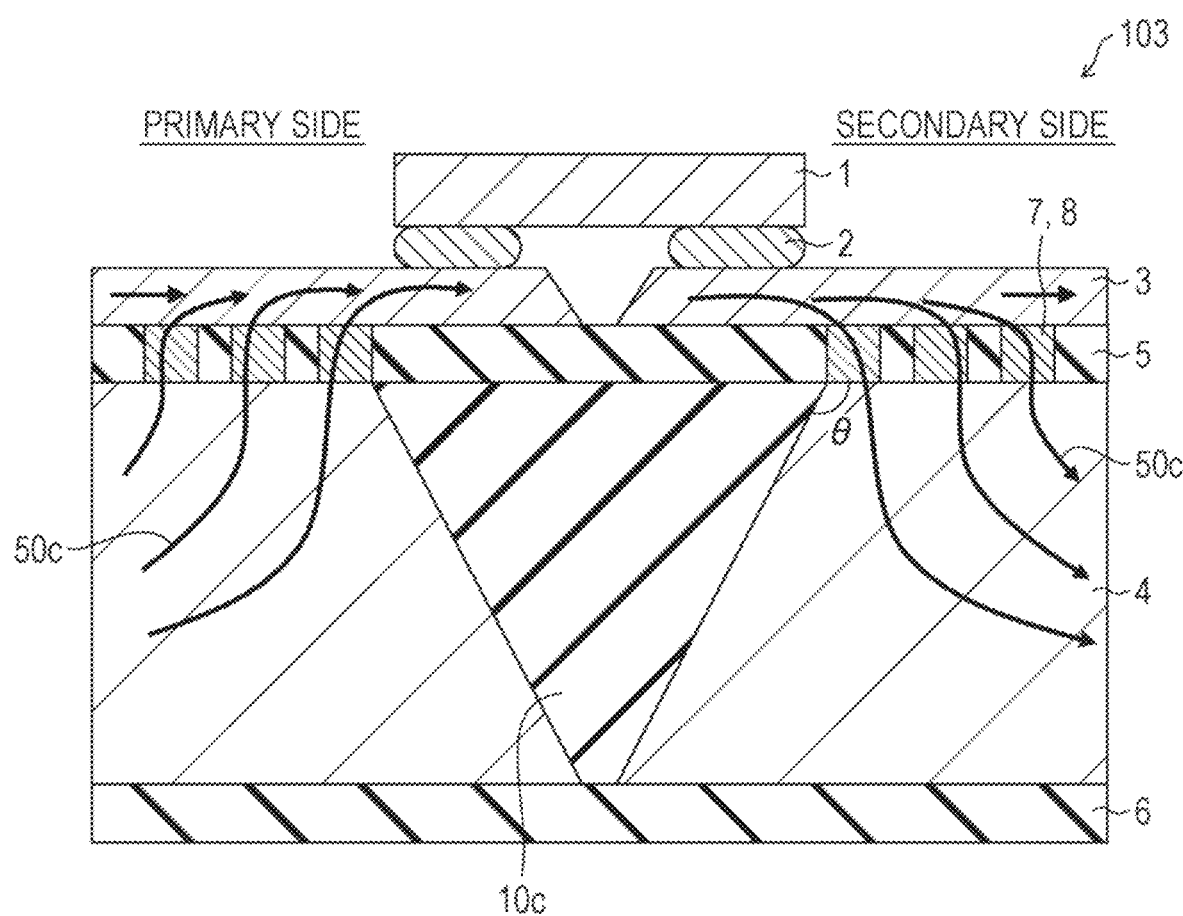
FIG. 12 is a cross-sectional view illustrating a structure of a conventional power module.

Meanwhile, as illustrated in FIG. 12, the power module 103 according to the conventional art is different from the power module 100 according to the first embodiment of the present disclosure in that the angle θ is 135 degrees. Other conditions are similar to those of the power module 100. Needless to say, the formation region of the vias 7 in the power module 100 according to the first embodiment of the present disclosure and the formation region of the vias 7 in the power module 103 according to the conventional art are different because of the difference in angle θ.

Figures 10A, 10B:
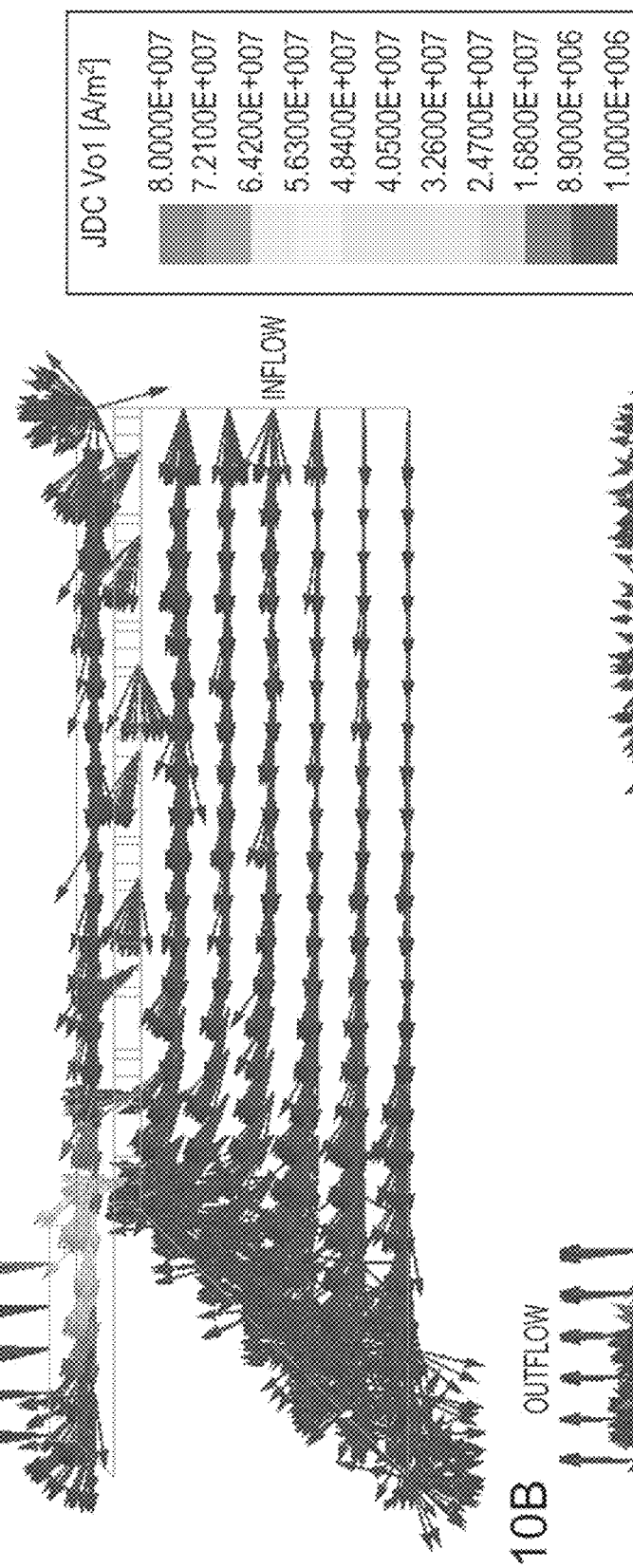
FIGS. 10A and 10B illustrate a result of comparison in electric current density simulation between the power module according to the first embodiment of the present disclosure and a power module according to a comparative example.
Figure 11A:
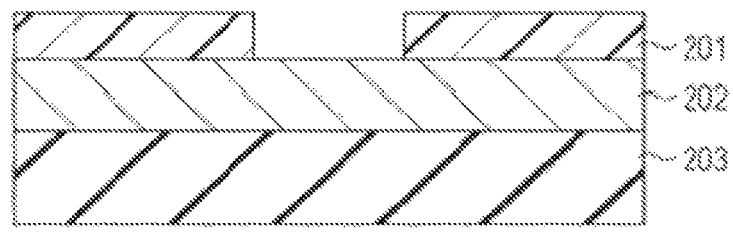
FIGS. 11A through 11C are cross-sectional views illustrating processing steps of wet etching.
Figure 11B:
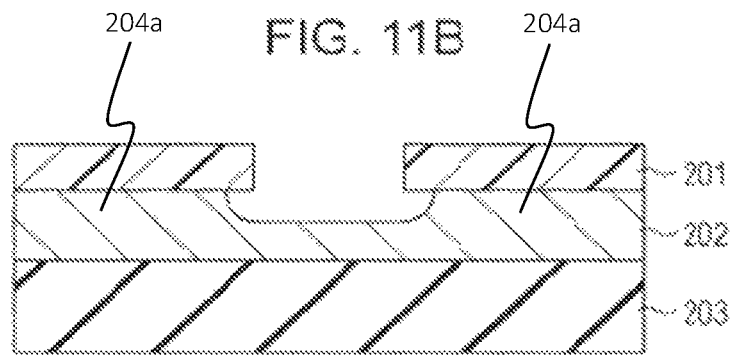
Figure 11C:
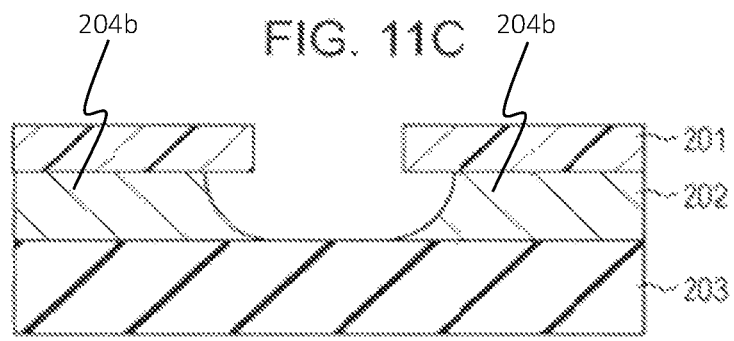

FIGS. 10E and 10B illustrate results of simulation of an electric current density in cases where an electric current of 30 A is applied to the power module 100 according to the first embodiment of the present disclosure and the power module 103 according to the conventional art. In FIGS. 10A and 10B, "JDC Vol" represents a direct-current density (unit: A/m$^2$). The "inflow" means inflow of an electric current from one of integrated terminal parts 30a and 30b into the power module. The "outflow" means outflow, from the solder 2, of an electric current flowing from the first conductive layer 3 into the power device 1 through the solder 2. A direction of an arrow represents a direction of flow of an electric current, and a density of an arrow corresponds to a direct-current density.

As illustrated in FIG. 10A, in a case where an electric current is applied to the power module 103 according to the conventional art, a rise in direct-current density in the first conductive layer 3 is observed right before a position of outflow of the electric current. Meanwhile, as illustrated in FIG. 10B, in a case where an electric current is applied to the power module 100 according to the first embodiment of the present disclosure, the direct-current density decreases to approximately 37.2% (a decrease rate is approximately 62.8%) as compared with the power module 103 according to the conventional art.

The result of the simulation illustrated in FIGS. 10A and 10B shows that according to the configuration of the first embodiment of the present disclosure, a rise in direct-current density in a case where as electric current is applied to the power module 100 is smaller than the conventional art.

Lifetime of Wire

One cause of a failure of a general power module is electromigration. A failure model formula in electromigration is generally expressed by the following empirical formula:

$$MTF = A \times J^{-n} \times \exp(E_a/kT)$$

In the empirical formula, MTF is a wire lifetime, A is a constant determined by a structure and a material of a wire, J is as electric current density, n is a constant concerning the electric current density, $E_a$ is activation energy, k is a Boltzmann constant, and T is an absolute temperature in a wire part. According to the result of the simulation, the maximum electric current density in the power module 100 according to the first embodiment of the present disclosure is approximately 37.2% of the maximum electric current density in the power module 103 according to the conventional art. Since the constant n concerning the electric current density is larger than 1 and is equal to or smaller than 2, it is expected that the wire lifetime in the power module 100 according to the first embodiment of the present disclosure is approximately 2.7 to 7.2 times as long as the wire lifetime in the power module 103 according to the conventional art. That is, the power module 100 according to the first embodiment of the present disclosure is hard to break and therefore can be used for a longer period.

Overview

A power module according to a first aspect of the present disclosure includes a multilayer substrate in which at least a first conductive layer having electrical conductivity, a first insulating layer having insulation properties, and a second conductive layer having electrical conductivity are stacked in this order. A primary-side electrode and a secondary-side electrode of a power device are disposed so as to straddle a plurality of separate primary and secondary wires in the first conductive layer. The second conductive layer includes a plurality of separate primary and secondary wires. An insulating part is disposed in the first insulating layer in a region that is between the primary wire and the secondary wire and is directly below the power device. An intralayer insulating part is disposed in the second conductive layer in a region that is between the primary wire and the secondary wire and is directly below the power device. One or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device.

According to the configuration, vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary side electrode of the power device. Accordingly, even in a case where a distance between the electrodes of the power device is short, an electric current path that passes a via directly below the electrodes of the power device can be formed, and therefore an electric current equal to or higher than an allowable current density in the first conductive layer does not flow. This can suppress a rise in electric current density and a rise in wire temperature, thereby allowing an increase in electric current capacity of the power module.

In the first aspect, the power module according to a second aspect of the present disclosure may be configured such that θ<π/2 is satisfied where θ is an angle formed in the second conductive layer between the first insulating layer and a boundary between the intralayer insulating part and the second conductive layer. According to the configuration, in which θ<π/2 is satisfied, a via can be provided directly below the electrodes of the power device. Accordingly, even in a case where a distance between the electrodes of the power device is short, an electric current path that passes a via directly below the electrodes of the power device can be formed, and therefore an electric current equal to or higher than an allowable current density in the first conductive layer does not flow. This can suppress a rise in electric current density and a rise in wire temperature, thereby allowing an increase in electric current capacity of the power module.

In the first aspect, the power module according to a third aspect of the present disclosure may be configured such that the first conductive layer, the first insulating layer, the second conductive layer, and a second insulating layer having insulation properties are stacked in this order in the multilayer substrate; and $\theta 1 > \pi/2$ and $\theta 2 > \pi/2$ are satisfied where $\theta 1$ is an angle formed in the second conductive layer between the first insulating layer and a boundary between the intralayer insulating part and the second conductive layer and $\theta 2$ is an angle formed in the second conductive layer between the second insulating layer and a boundary between the intralayer insulating part and the second conductive layer. According to the configuration, in which $\theta 1 > \pi/2$ and $\theta 2 > \pi/2$ are satisfied, a via can be provided directly below the electrodes of the power device. Accordingly, even in a case where a distance between the electrodes of the power device is short, an electric current path that passes a via directly below the electrodes of the power device can be formed, and therefore an electric current equal to or higher than an allowable current density in the first conductive layer does not flow. This can suppress a rise in electric current density and a rise in wire temperature, thereby allowing an increase in electric current capacity of the power module.

In any one of the first through third aspects, the power module according to a fourth aspect of the present disclosure may be configured such that the second conductive layer is thicker than the first conductive layer. According to the configuration, in which the second conductive layer is thicker than the first conductive layer, an electric current capacity of the second conductive layer becomes large, and therefore an electric current capacity of the power module can be increased.

In any one of the first through fourth aspects, the power module according to a fifth aspect of the present disclosure may be configured such that a terminal structure for connection with an outside is formed in at least part of the second conductive layer. According to the configuration, an electric current flows into and out from the terminal provided in the second conductive layer. This can reduce frequency of flow of an electric current from the first conductive layer to the second conductive layer through the via and reduce resistance as compared with a case where a terminal is provided in the first conductive layer.

In any one of the first through fifth aspects, the power module according to a sixth aspect of the present disclosure may be configured such that the plurality of vias are disposed in the first insulating layer directly below the primary-side electrode and the secondary-side electrode of the power device; the plurality of vias are disposed in the first insulating layer so as to be located in an electrode disposition region in which an electrode that connects the power device and the first conductive layer is disposed; and one or more of the plurality of vias are disposed close to an end of the electrode disposition region. According to the configuration, in a case where a large number of vias are formed within a range of an electrode in a power device mounting region, the vias are disposed so that a distance from an end of the electrode disposition region to an end of a closest via becomes short. This can reduce an electric current density.

In the first aspect, the power module according to a seventh aspect of the present disclosure may be configured such that the plurality of vias are disposed in the first insulating layer directly below the primary-side electrode and the secondary-side electrode of the power device; the plurality of vias are disposed in the first insulating layer so as to be located in a via formation region including an electrode disposition region in which an electrode that connects the power device and the first conductive layer is disposed and a region outside the electrode disposition region; and a length of the via formation region in a direction parallel with a substrate surface is 1.5 or more times as large as a length of the electrode disposition region in the direction parallel with the substrate surface. According to the configuration, in which a large number of vias are also provided outside the power device mounting region 8 the electrode disposition region), an electric current density can be reduced. In this case, it is desirable that a length of the via formation region in a direction parallel with a substrate surface be 1.5 or more times as large as a length of the electrode disposition region in the direction parallel with the substrate surface.

In the first aspect, the power module according to an eighth aspect of the present disclosure may be configured such that the plurality of vias are disposed in the first insulating layer directly below the primary-side electrode and the secondary-side electrode of the power device; the plurality of vias are disposed in the first insulating layer so as to be located in an electrode disposition region in which an electrode that connects the power device and the first conductive layer is disposed; and a diameter of the plurality of vias is 0.1 mm to 0.4 mm. According to the configuration, in a case where a plurality of vias are provided within a range of an electrode in the power device mounting region, a distance between centers of adjacent vias sometimes need be approximately twice as large as a via diameter due to a restriction in production. Under such a condition, an electric current density can be reduced in a case where the via diameter is approximately 0.1 mm to 0.4 mm.

In any one of the fourth through eighth aspects, the power module according to a ninth aspect of the present disclosure may be configured such that the plurality of vias are disposed in the first insulating layer directly below the primary-side electrode and the secondary-side electrode of the power device; and a total area of cross sections of the plurality of vias in a direction parallel with a substrate surface is larger than an area of a cross section of the first conductive layer perpendicular to a direction of flow of an electric current. According to the configuration, an electric current easily flows from the first conductive layer to the thick second conductive layer through the vias, and it is therefore possible to suppress concentration of an electric current density directly below the electrode of the power device.

In the seventh aspect, the power module according to a tenth aspect of the present disclosure may be configured such that the second conductive layer has a first region extending in a first direction that is a direction parallel with the substrate surface of the via formation region and a second region that extends in a second direction different from the first direction and is adjacent to the first region; and a length, in the second direction, of a part of the via formation region outside the electrode disposition region is 0.5 or more times as large as a length of the electrode disposition region in the first direction.

According to the configuration, even in a case where the second conductive layer is curved from the first direction to the second direction, an electric current density can be reduced by providing the vias so that a length in the second direction outside the power device mounting region (the electrode disposition region) is 0.5 or more times as large as a length of the electrode disposition region in the first direction.

In the tenth aspect, the power module according to an eleventh aspect of the present disclosure may be configured such that $\pi/4<\theta 3<\pi/2$ is satisfied where $\theta 3$ is an angle formed between the first region and the second region. According to the configuration, it is possible to provide a power module including a second conductive layer that is curved in a range from $\pi/4$ to $\pi/2$ while keeping an electric current density small.

A power module according to a twelfth aspect of the present disclosure includes a multilayer substrate in which at least a first conductive layer having electrical conductivity, a first insulating layer having insulation properties, and a second conductive layer having electrical conductivity are stacked in this order. A primary-side electrode and a secondary-side electrode of a power device are disposed so as to straddle a plurality of separate primary and secondary wires in the first conductive layer. The second conductive layer includes a plurality of separate primary and secondary wires. An insulating part is diposed in the first insulating layer in a region that is between the primary wire and the secondary wire and is directly below the power device. One or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device.

According to the configuration, vias that connect the primary wire in the first conductive layer and the primary wire in the second conductive layer and connect the secondary wire in the first conductive layer and the secondary wire in the second conductive layer are disposed in the first insulating layer directly below the primary side electrode and the secondary-side electrode of the power device. Accordingly, even in a case where a distance between the electrodes of the power device is short, an electric current path that passes a via directly below the electrodes of the power device can be formed, and therefore an electric current equal to or higher than an allowable current density in the first conductive layer does not flow. This can suppress a rise in electric current density and a rise in wire temperature, thereby allowing an increase in electric current capacity of the power module.

Additional Remarks

The present disclosure is not limited to the above embodiments and can be changed in various ways within the scope of the claims, and embodiments obtained by combining technical means disclosed in different embodiments as appropriate are also encompassed within the technical scope of the present disclosure. Furthermore, a new technical feature may be created by combining technical means disclosed in the embodiments.

The present disclosure contains subject matter related to that disclosed in Japanese Priority Patent Application JP 2018-106507 filed in the Japan Patent Office on Jun. 1, 2018 and Japanese Priority Patent Application JP 2019-043091 filed in the Japan Patent Office on Mar. 8, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A power module comprising a multilayer substrate in which at least a first conductive layer having electrical conductivity, a first insulating layer having insulation properties, and a second conductive layer having electrical conductivity are stacked in this order,
    wherein a primary-side electrode and a secondary-side electrode of a power device are disposed so as to straddle a plurality of separate primary and secondary wires in the first conductive layer,
    wherein the second conductive layer includes a plurality of separate primary and secondary wires,
    wherein an insulating part is disposed in the first insulating layer in a region that is between the primary wire and the secondary wire of the first conductive layer and is directly below the power device,
    wherein an intralayer insulating part is disposed in the second conductive layer in a region that is between the primary wire and the secondary wire of the second conductive layer and is directly below the power device,
    wherein one or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device;
    the plurality of vias are disposed in the first insulating layer so as to be located in a via formation region including an electrode disposition region in which an electrode that connects the power device and the first conductive layer is disposed and a region outside the electrode disposition region; and
    a length of the via formation region in a direction parallel with a substrate surface is 1.5 or more times as large as a length of the electrode disposition region in the direction parallel with the substrate surface.

2. The power module according to claim 1, wherein the second conductive layer is thicker than the first conductive layer.

3. The power module according to claim 2, wherein the plurality of vias are disposed in the first insulating layer directly below the primary-side electrode and the secondary-side electrode of the power device; and
    a total area of cross sections of the plurality of vias in the direction parallel with the substrate surface is larger than an area of a cross section of the first conductive layer perpendicular to a direction of flow of an electric current.

4. The power module according to claim 1, wherein a terminal structure for connection with an outside is formed in at least part of the second conductive layer.

5. The power module according to claim 1, wherein the plurality of vias are disposed in the first insulating layer directly below the primary-side electrode and the secondary-side electrode of the power device;
    the plurality of vias are disposed in the first insulating layer so as to be located in the electrode disposition region in which the electrode that connects the power device and the first conductive layer is disposed; and
    one or more of the plurality of vias are disposed close to an end of the electrode disposition region.

6. The power module according to claim 1, wherein the plurality of vias are disposed in the first insulating layer directly below the primary-side electrode and the secondary-side electrode of the power device;
    the plurality of vias are disposed in the first insulating layer so as to be located in the electrode disposition region in which the electrode that connects the power device and the first conductive layer is disposed; and
a diameter of the plurality of vias is 0.1 mm to 0.4 mm.

7. The power module according to claim 1, wherein
the second conductive layer has a first region extending in a first direction that is the direction parallel with the substrate surface of the via formation region and a second region that extends in a second direction different from the first direction and is adjacent to the first region; and
a length, in the second direction, of a part of the via formation region outside the electrode disposition region is 0.5 or more times as large as the length of the electrode disposition region in the first direction.

8. The power module according to claim 7, wherein $\pi/4<\theta 3<\pi/2$ is satisfied where $\theta 3$ is an angle formed between the first region and the second region.

9. A power module comprising a multilayer substrate in which at least a first conductive layer having electrical conductivity, a first insulating layer having insulation properties, and a second conductive layer having electrical conductivity are stacked in this order,
wherein a primary-side electrode and a secondary-side electrode of a power device are disposed so as to straddle a plurality of separate primary and secondary wires in the first conductive layer,
wherein the second conductive layer includes a plurality of separate primary and secondary wires,
wherein an insulating part is disposed in the first insulating layer in a region that is between the primary wire and the secondary wire of the first conductive layer and is directly below the power device,
wherein an intralayer insulating part is disposed in the second conductive layer in a region that is between the primary wire and the secondary wire of the second conductive layer and is directly below the power device,
wherein one or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device; and
wherein $\theta<\pi/2$ is satisfied where $\theta$ is an angle formed in the second conductive layer between the first insulating layer and a boundary between the intralayer insulating part and the second conductive layer.

10. The power module according to claim 9, wherein the second conductive layer is thicker than the first conductive layer.

11. The power module according to claim 10, wherein
the plurality of vias are disposed in the first insulating layer directly below the primary-side electrode and the secondary-side electrode of the power device; and
a total area of cross sections of the plurality of vias in a direction parallel with a substrate surface is larger than an area of a cross section of the first conductive layer perpendicular to a direction of flow of an electric current.

12. The power module according to claim 9, wherein
a terminal structure for connection with an outside is formed in at least part of the second conductive layer.

13. The power module according to claim 9, wherein
the plurality of vias are disposed in the first insulating layer directly below the primary-side electrode and the secondary-side electrode of the power device;
the plurality of vias are disposed in the first insulating layer so as to be located in an electrode disposition region in which an electrode that connects the power device and the first conductive layer is disposed; and
one or more of the plurality of vias are disposed close to an end of the electrode disposition region.

14. The power module according to claim 9, wherein
the plurality of vias are disposed in the first insulating layer directly below the primary-side electrode and the secondary-side electrode of the power device;
the plurality of vias are disposed in the first insulating layer so as to be located in an electrode disposition region in which an electrode that connects the power device and the first conductive layer is disposed; and
a diameter of the plurality of vias is 0.1 mm to 0.4 mm.

15. A power module comprising a multilayer substrate in which at least a first conductive layer having electrical conductivity, a first insulating layer having insulation properties, and a second conductive layer having electrical conductivity are stacked in this order,
wherein a primary-side electrode and a secondary-side electrode of a power device are disposed so as to straddle a plurality of separate primary and secondary wires in the first conductive layer,
wherein the second conductive layer includes a plurality of separate primary and secondary wires,
wherein an insulating part is disposed in the first insulating layer in a region that is between the primary wire and the secondary wire of the first conductive layer and is directly below the power device,
wherein an intralayer insulating part is disposed in the second conductive layer in a region that is between the primary wire and the secondary wire of the second conductive layer and is directly below the power device,
wherein one or a plurality of vias that connect the primary wire in the first conductive layer and the primary wire in the second conductive layer and connect the secondary wire in the first conductive layer and the secondary wire in the second conductive layer are disposed in the first insulating layer directly below the primary-side electrode and the secondary-side electrode of the power device;
wherein the first conductive layer, the first insulating layer, the second conductive layer, and a second insulating layer having insulation properties are stacked in this order in the multilayer substrate; and
$\theta 1>\pi/2$ and $\theta 2>\pi/2$ are satisfied where $\theta 1$ is an angle formed in the second conductive layer between the first insulating layer and a boundary between the intralayer insulating part and the second conductive layer and $\theta 2$ is an angle formed in the second conductive layer between the second insulating layer and a boundary between the intralayer insulating part and the second conductive layer.

16. The power module according to claim 15, wherein
the second conductive layer is thicker than the first conductive layer.

17. The power module according to claim 16, wherein
the plurality of vias are disposed in the first insulating layer directly below the primary-side electrode and the secondary-side electrode of the power device; and a total area of cross sections of the plurality of vias in a direction parallel with a substrate surface is larger than an area of a cross section of the first conductive layer perpendicular to a direction of flow of an electric current.

18. The power module according to claim 15, wherein a terminal structure for connection with an outside is formed in at least part of the second conductive layer.

19. The power module according to claim 15, wherein the plurality of vias are disposed in the first insulating layer directly below the primary-side electrode and the secondary-side electrode of the power device;

the plurality of vias are disposed in the first insulating layer so as to be located in an electrode disposition region in which an electrode that connects the power device and the first conductive layer is disposed; and one or more of the plurality of vias are disposed close to an end of the electrode disposition region.

20. The power module according to claim 15, wherein the plurality of vias are disposed in the first insulating layer directly below the primary-side electrode and the secondary-side electrode of the power device;

the plurality of vias are disposed in the first insulating layer so as to be located in an electrode disposition region in which an electrode that connects the power device and the first conductive layer is disposed; and a diameter of the plurality of vias is 0.1 mm to 0.4 mm.

* * * * *